(12) United States Patent
Yoon

(10) Patent No.: US 10,073,744 B2
(45) Date of Patent: Sep. 11, 2018

(54) POWER-DOWN INTERRUPT OF NONVOLATILE DUAL IN-LINE MEMORY SYSTEM

(71) Applicant: SK hynix Inc., Gyeonggi-do (KR)

(72) Inventor: HyunJu Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 93 days.

(21) Appl. No.: 15/244,745

(22) Filed: Aug. 23, 2016

(65) Prior Publication Data
US 2017/0277593 A1    Sep. 28, 2017

(30) Foreign Application Priority Data
Mar. 28, 2016 (KR) .................. 10-2016-0036638

(51) Int. Cl.
| | | |
|---|---|---|
| G06F 11/14 | (2006.01) | |
| G06F 3/06 | (2006.01) | |
| G11C 5/04 | (2006.01) | |
| G11C 5/14 | (2006.01) | |
| G11C 7/20 | (2006.01) | |
| G11C 11/00 | (2006.01) | |
| G11C 14/00 | (2006.01) | |

(52) U.S. Cl.
CPC ........ G06F 11/1451 (2013.01); G06F 3/0619 (2013.01); G06F 3/0647 (2013.01); G06F 3/0653 (2013.01); G06F 3/0685 (2013.01); G06F 11/1469 (2013.01); G11C 5/04 (2013.01); G11C 5/144 (2013.01); G11C 7/20 (2013.01); G11C 11/005 (2013.01); G06F 2201/805 (2013.01); G06F 2201/82 (2013.01); G06F 2201/84 (2013.01); G11C 14/0009 (2013.01)

(58) Field of Classification Search
CPC ............. G06F 11/1441; G06F 11/1466; G06F 11/1471; G06F 11/1458; G06F 11/14; G06F 11/1448; G06F 11/1464; G06F 11/1666
See application file for complete search history.

(56) References Cited

U.S. PATENT DOCUMENTS

| | | | | |
|---|---|---|---|---|
| 7,865,679 B2 * | 1/2011 | Sartore | ............... | G06F 12/0638 711/118 |
| 8,874,831 B2 * | 10/2014 | Lee | ..................... | G06F 12/0246 365/185.33 |
| 9,519,544 B2 * | 12/2016 | Song | ..................... | G06F 3/0619 |
| 9,535,828 B1 * | 1/2017 | McKelvie | ........... | G06F 12/0246 |
| 2011/0010499 A1 * | 1/2011 | Tsukamoto | ......... | G06F 11/1441 711/118 |

* cited by examiner

Primary Examiner — Nadeem Iqbal
(74) Attorney, Agent, or Firm — IP & T Group LLP

(57) ABSTRACT

A nonvolatile memory module includes volatile memory devices; a nonvolatile memory device; and a controller suitable for backing up data stored in the volatile memory devices or restoring data backed up in the nonvolatile memory device, according to a fail/recovery of power of the host, the controller including a power-down interrupt logic which interrupts a backup operation when the power of the host is recovered while performing the backup operation, the power-down interrupt logic including: a logic which determines whether sufficient erased blocks exist in the nonvolatile memory device; a logic which erases a new block when the sufficient erased bocks do not exist; and an interrupt backup logic which backs up a volatile memory device having data corresponding to the erased block, when a fail in the power of the host is detected or a backup operation is instructed from the host.

18 Claims, 13 Drawing Sheets

(RELATED ART)　　　　(RELATED ART)

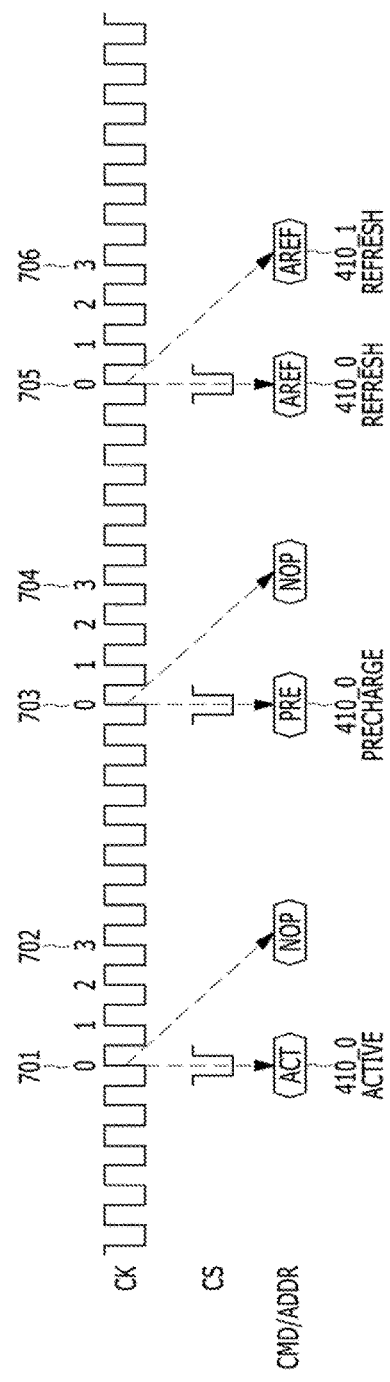
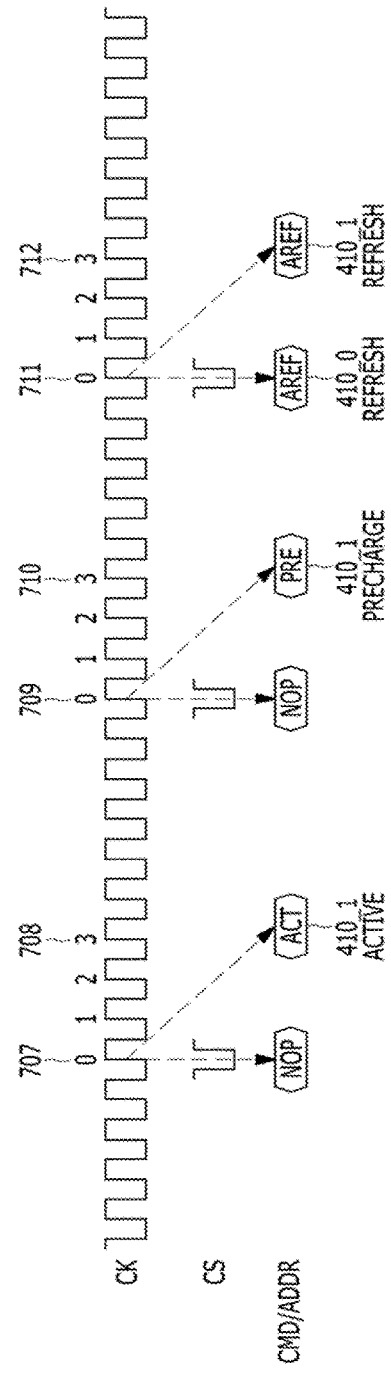
FIG. 7A
FIG. 7B

POWER-DOWN INTERRUPT OF NONVOLATILE DUAL IN-LINE MEMORY SYSTEM

CROSS-REFERENCE TO RELATED APPLICATION

This application claims priority under 35 U.S.C. § 119 to Korean Patent Application No. 10-2016-0036638 filed on Mar. 28, 2016, the disclosure of which is incorporated herein by reference in its entirety.

TECHNICAL FIELD

Exemplary embodiments relate to a nonvolatile dual in-line memory system, a memory module and a method for operating the memory module, and more particularly, to a technology capable of independently accessing volatile memory devices by a controller while reducing the number of wiring lines.

DISCUSSION OF THE RELATED ART

In most memory systems, there may be one to many relationship between a controller and memory devices.

As shown in FIG. 1A, when a control bus that is, a bus through which a command CMD and an address ADDR are transmitted CMD/ADDR_BUS0 and a data bus DATA_BUS0 between a controller 100 and a memory device 110_0, and a control bus CMD/ADDR_BUS1 and a data bus DATA_BUS1 between the controller 100 and a memory device 110_1, are separated, the controller 100 may control separate operations for the memory device 110_0 and the memory device 110_1. For example, while a read operation is performed in the memory device 110_0, a write operation may be performed in the memory device 110_1.

As shown in FIG. 1B, when a control bus CMD/ADDR_BUS and a data bus DATA_BUS are shared by memory devices 110_0 and 110_1, lines for transmitting signals CS0 and CS1 to identify the memory devices 110_0 and 110_1 are provided. That is, the lines for transmitting some signals CS0 and CS1 among signals to be transmitted through the control bus CMD/ADDR_BUS are not shared and should be separately provided for the respective memory devices 110_0 and 110_1. In this case, a memory device, between the memory devices 110_0 and 110_1, selected by the signal CS0 or CS1 may perform an operation instructed through the control bus CMD/ADDR_BUS and may exchange signals with the controller 100 through the data bus DATA_BUS.

As the number of memory devices coupled with a controller increases, the number of wiring lines required also increases, which increases difficulty in system design and increases the fabrication cost.

SUMMARY

Various embodiments are directed to a nonvolatile dual in-line memory system, a memory module and a method for operating the memory module, wherein, when performing a backup/restoration operation in a nonvolatile dual in-line memory module by the power fail/recovery of a host, the backup/restoration operation is performed by independently accessing volatile memory devices while reducing the number of wiring lines of a data bus in the memory module, and it is possible to quickly deal with a secondary power-down likely to successively occur when the power of the host is recovered while performing the power-down backup operation.

In an embodiment, a nonvolatile memory module may include: a plurality of volatile memory devices sharing a data bus through which data is transmitted and a control bus through which a command and an address are transmitted; at least one nonvolatile memory device; and a controller suitable for backing up data stored in the plurality of volatile memory devices in the nonvolatile memory device or restoring data backed up in the nonvolatile memory device to the plurality of volatile memory devices, according to a fail/recovery of power of a host, the controller including a power-down interrupt logic which interrupts a backup operation when the power of the host is recovered while performing the backup operation, the power-down interrupt logic including: a logic which determines whether a sufficient amount of erased blocks for data backup exist in the nonvolatile memory device, to prepare for a fail in the power of the host; a logic which erases a new block when the sufficient amount of erased bocks do not exist in the nonvolatile memory device; and an interrupt backup logic which backs up a volatile memory device having data corresponding to an erased block of the nonvolatile memory device, in the nonvolatile memory device, when a fall in the power of the host is detected or a backup operation is instructed from the host.

The interrupt backup logic may set a command address latency (CAL) for identifying the volatile memory device having the data corresponding to the erased block among the plurality of volatile memory devices which share the data bus and the control bus, to a first value, and may set a command address latency of remaining volatile memory devices among the plurality of volatile memory devices, to a second value different from the first value.

The second value may be greater than the first value, and a difference between the second value and the first value may be equal to or greater than a row address to column address delay time (tRCD: RAS to CAS delay).

The difference between the second value and the first value may be less than a row precharge time (tRP).

The controller may resume the backup operation interrupted by the power-down interrupt logic, after performing the backing up by the interrupt backup logic.

The interrupt backup logic may include a logic which performs a distributed refresh operation for uniformly distributing a refresh cycle over the plurality of volatile memory devices while programming a memory page of the nonvolatile memory device; a logic which operates the plurality of volatile memory devices under a low power mode having a power lower than a power of a complete operation state, while a new memory page of the nonvolatile memory device is prepared and written; and a logic which recovers the plurality of volatile memory devices to a power mode of the complete operation state after the new memory page of the nonvolatile memory device is written.

In an embodiment, a method for operating a nonvolatile memory module including a plurality of volatile memory devices which share a data bus through which data is transmitted and a control bus through which a command and an address are transmitted, a nonvolatile memory device, and a controller which backs up data stored in the plurality of volatile memory devices in the nonvolatile memory device or restores data backed up in the nonvolatile memory device to the plurality of volatile memory devices, according to a fail/recovery of power of a host may include: interrupting a backup operation when the power of the host is recovered while performing the backup operation; determining whether a sufficient amount of erased blocks for data backup exist in the nonvolatile memory device, to prepare for a fail in the power of the host which may occur; erasing a new block when the sufficient amount of erased bocks do not exist in the nonvolatile memory device; and backing up a volatile memory device having data corresponding to an erased block of the nonvolatile memory device, in the nonvolatile memory device, when a fail in the power of the host is detected or a backup operation is instructed from the host.

In backing up a volatile memory device having data corresponding to an erased block of the nonvolatile memory device, a command address latency (CAL) for identifying the volatile memory device having the data corresponding to the erased block among the plurality of volatile memory devices which share the data bus and the control bus may be set to a first value, and a command address latency of remaining volatile memory devices among the plurality of volatile memory devices may be set to a second value different from the first value.

The second value may be greater than the first value, and a difference between the second value and the first value may be equal to or greater than a row address to column address delay time (tRCD: RAS to CAS delay).

The difference between the second value and the first value may be less than a row precharge time (tRP).

The controller may resume the backup operation interrupted when the power of the host is recovered while performing the backup operation, after performing the interrupt backup of backing up a volatile memory device having data corresponding to an erased block of the nonvolatile memory device.

The backing up a volatile memory device having data corresponding to an erased block of the nonvolatile memory device may include performing a distributed refresh operation for uniformly distributing a refresh cycle over the plurality of volatile memory devices while programming a memory page of the nonvolatile memory device; operating the plurality of volatile memory devices under a low power mode having a power lower than a power of a complete operation state, while a new memory page of the nonvolatile memory device is prepared and written; and recovering the plurality of volatile memory devices to a power mode of the complete operation state after the new memory page of the nonvolatile memory device is written.

According to the nonvolatile dual in-line memory system, the memory module and the method for operating the memory module, when performing a backup/restoration operation in a nonvolatile dual in-line memory module by the power fail/recovery of a host, it is possible to perform the backup/restoration operation by independently accessing volatile memory devices while reducing the number of wiring lines of a data bus in the memory module, and it is possible to quickly deal with a secondary power-down likely to successively occur when the power of the host is recovered while performing the power-down backup operation.

BRIEF DESCRIPTION OF THE DRAWINGS

FIGS. 7A and 7B are timing diagrams illustrating operations 521 and 522 of FIG. 5.

DETAILED DESCRIPTION

Figure 1A:
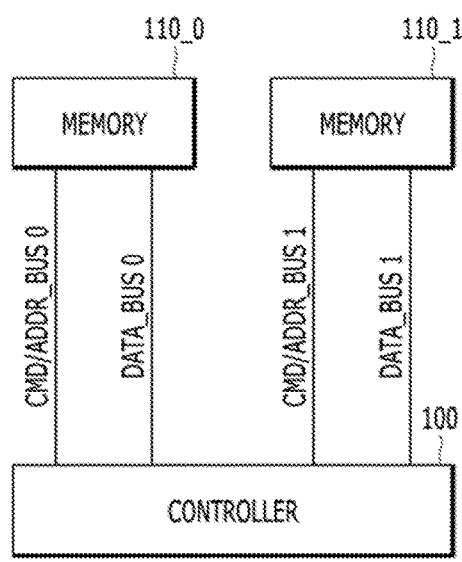
FIGS. 1A and 1B are block diagrams illustrating examples of bus connections between a controller and a memory device in a memory system.
Figure 1B:
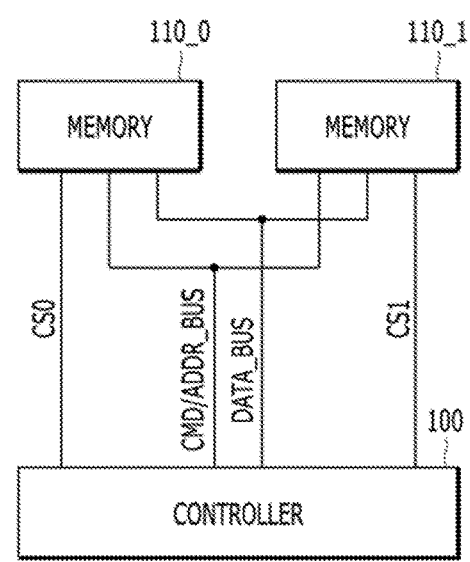

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present disclosure relates to a nonvolatile dual in-line memory system, and provides a memory system in which a controller in a memory module may independently access volatile memory devices and share a data bus and a control bus to reduce the number of wiring lines. Hereafter, to facilitate understanding of a nonvolatile dual in-line memory system in accordance with an embodiment, descriptions will be made sequentially from detailed configurations of the entire system.

Per-DRAM Addressability (PDA) Mode of Volatile Memory Device

First, descriptions will be made for the per-DRAM addressability (PDA) mode and the command address latency (CAL) of a volatile memory device.

Figure 2:
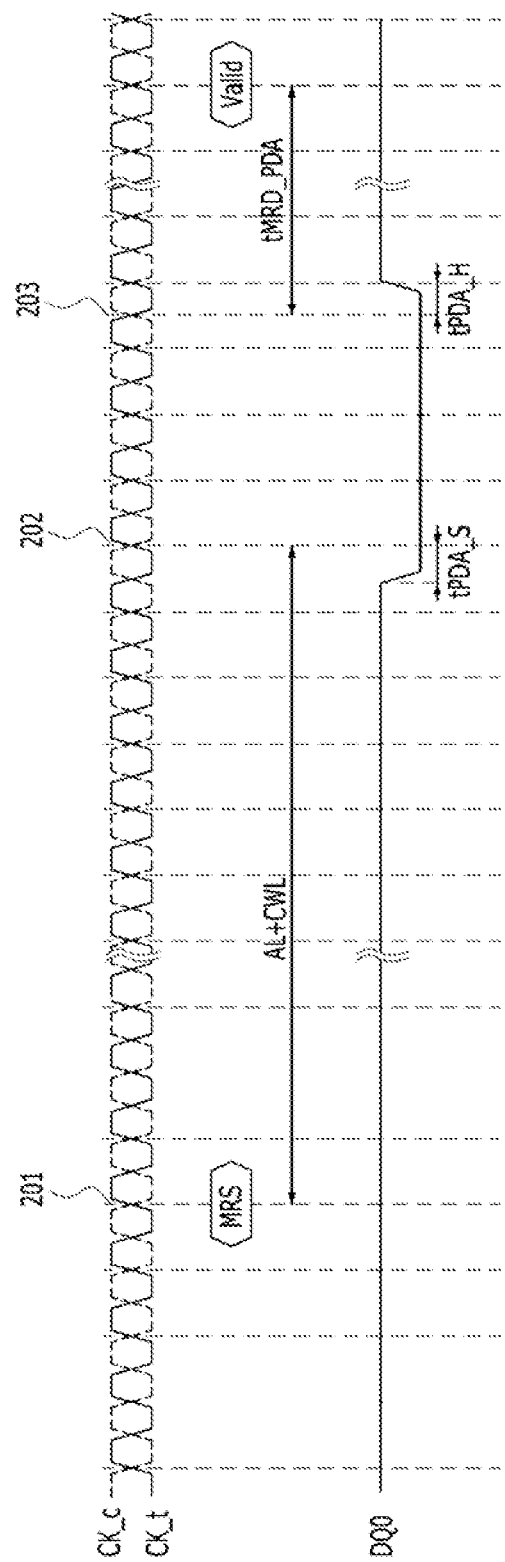
FIG. 2 is a timing diagram illustrating the operation of a mode register set (MRS) under a per-DRAM addressability (PDA) mode in a volatile memory device.

FIG. 2 is a timing diagram Illustrating the operation of a mode register set (MRS) under a per-DRAM addressability (PDA) mode in a volatile memory device.

The PDA mode refers to a mode that controls an independent mode register set operation performed for each volatile memory device. When the PDA mode is set, validity of all mode register set commands may be determined according to the signal level of a zeroth data pad DQ0. After a write latency WL defined as WL=AL+CWL where WL denotes write latency, AL denotes additive latency and CWL denotes CAS write latency, passes from the application time of a mode register set command, when the signal level of the zeroth data pad DQ0 is '0,' all mode register set commands applied may be determined as valid. Moreover, when the signal level of the zeroth data pad DQ0 is '1,' all mode register set commands applied may be determined as invalid and thus can be neglected.

Referring to FIG. 2, at a point of time 201, a mode register set command MRS is applied to a volatile memory device. At a point of time 202 when a time corresponding to a write latency WL where WL=AL+CWL passes from the point of time 201, the signal level of the zeroth data pad DQ0 transitions to '0' and is retained for a predetermined period. Therefore, the mode register set command MRS applied at the point of time 201 is determined as valid, and the setting operation of the volatile memory device by using an address (not shown) inputted together with the mode register set command MRS is performed for a tMRD_PDA that is, a mode register set command cycle time from a point of time 203.

If the signal level of the zeroth data pad DQ0 is continuously retained as '1' at the point of time 202, the mode register set command MRS applied at the point of time 201 is determined as invalid and is thus neglected. That is, the setting operation of the volatile memory device is not performed.

Command Address Latency (CAL) of Volatile Memory Device

Figure 3:
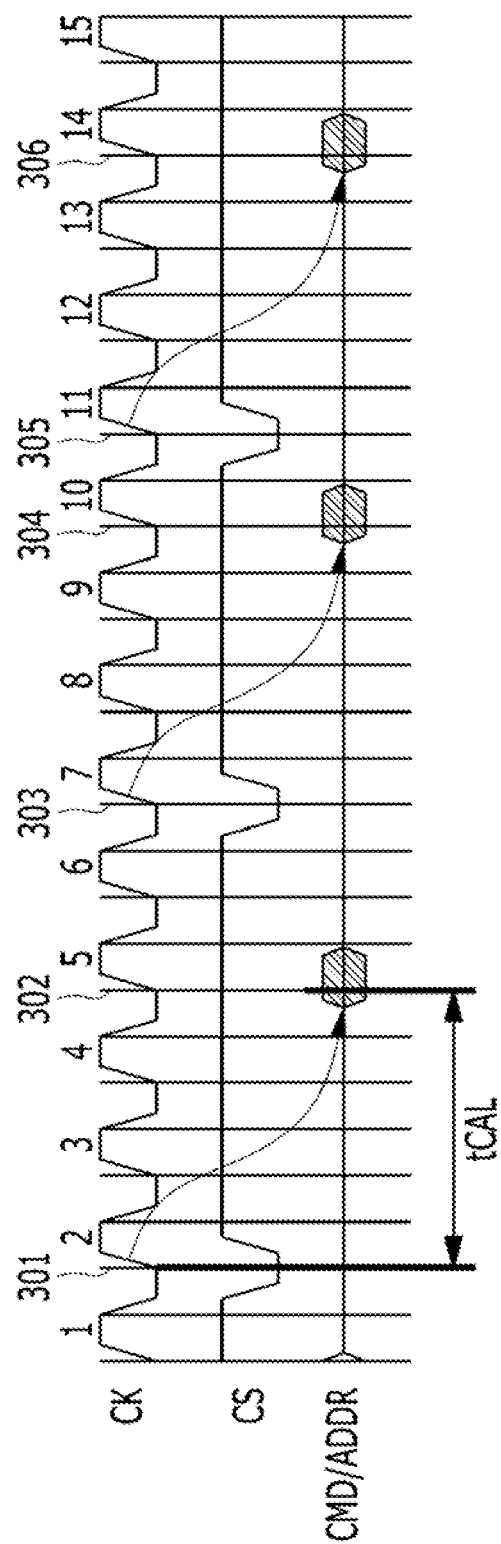
FIG. 3 is a timing diagram illustrating a command address latency (CAL) of a volatile memory device.

FIG. 3 is a timing diagram illustrating a command address latency (CAL) of a volatile memory device.

The CAL indicates the timing difference between a chip select signal CS serving as a reference signal and the remaining signals among control signals to be transferred through a control bus (CMD/ADDR_BUS). If the CAL is set, a volatile memory device recognizes only the control signals as valid which were inputted after a time corresponding to the CAL passes from the enable time of the chip select signal CS. The value of the CAL may be set by a mode register set (MRS).

FIG. 3 shows an operation when the CAL is set to 3 (3 clock cycles). At a point of time 302 when 3 clocks pass after a point of time 301 when the chip select signal CS is enabled to a low level, a command CMD and an address ADDR are applied to the volatile memory device. Then, the volatile memory device may recognize the command CMD and the address ADDR applied at the point of time 302, as valid. If the command CMD and the address ADDR are applied to the volatile memory device at the same point of time as the point of time 301 when the chip select signal CS is enabled or at a point of time when 1 clock or 2 clocks pass from the point of time 301 when the chip select signal CS is enabled, the volatile memory device does not recognize the command CMD and the address ADDR as valid.

Since the command CMD and the address ADDR are also applied at points of time 304 and 306 when a time corresponding to the CAL that is, 3 clocks passes from respective points of time 303 and 305 when the chip select signal CS is enabled, the command CMD and the address ADDR applied at the points of time 304 and 306 may be recognized as valid by the volatile memory device.

Basic Configuration of Dual In-Line Memory Module (DIMM)

Figure 4:
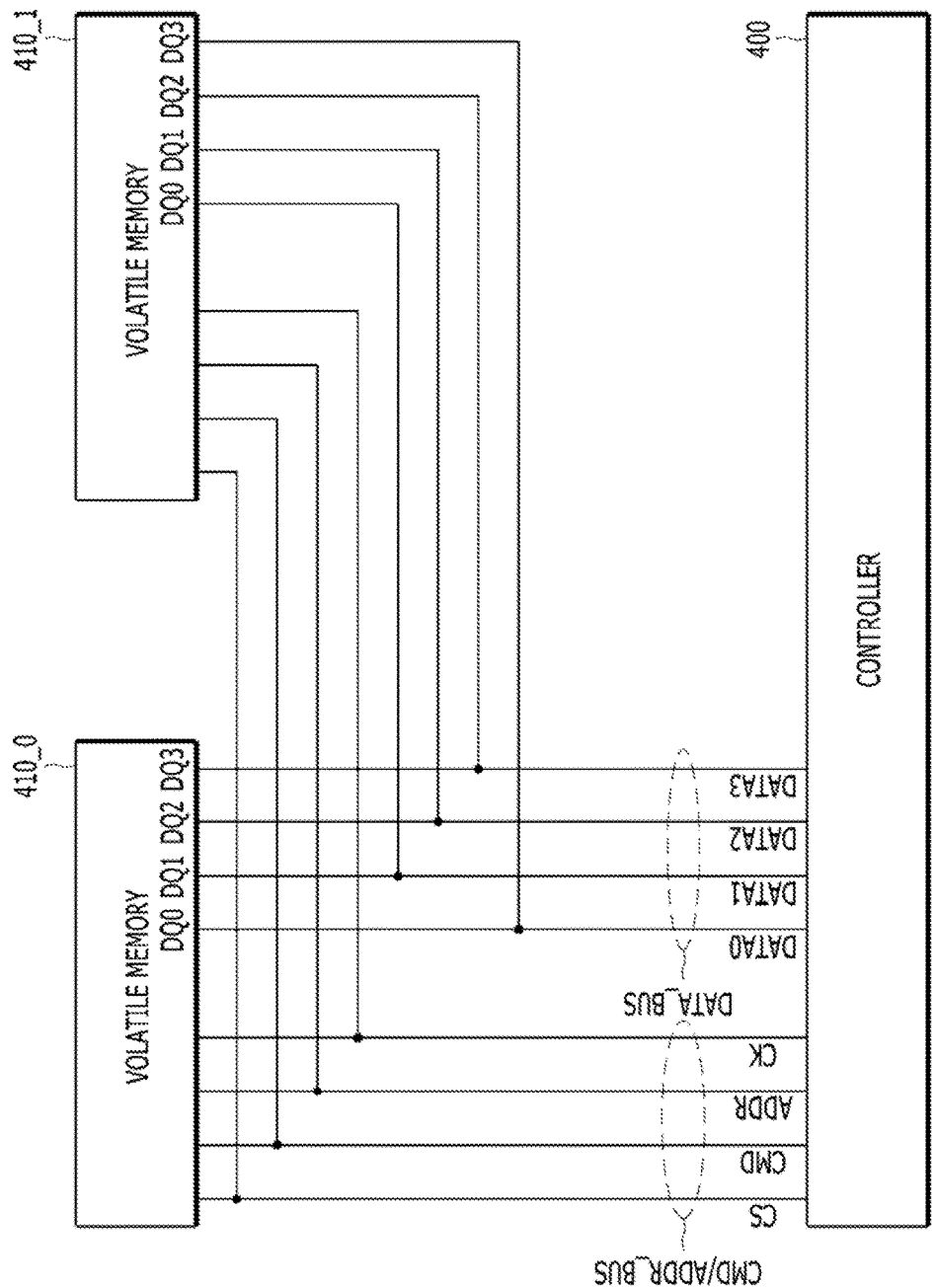
FIG. 4 is a block diagram illustrating a memory system in accordance with an embodiment.

FIG. 4 is a block diagram illustrating a memory system in accordance with an embodiment. FIG. 4 exemplifies the basic configuration of a dual in-line memory module (DIMM).

Referring to FIG. 4, the memory system may include a controller 400, a first volatile memory device 410_0, a second volatile memory device 410_1, a control bus CMD/ADDR_BUS, and a data bus DATA_BUS.

Control signals are transferred to the volatile memory devices 410_0 and 410_1 through the control bus CMD/ADDR_BUS from the controller 400. The control signals may include a command CMD, an address ADDR and a clock CK. The command CMD may include a plurality of signals. For example, the command CMD may include an active signal (ACT), a row address strobe signal (RAS), a column address strobe signal (CAS) and a chip select signal (CS). While the chip select signal CS is a signal which is included in the command CMD, the chip select signal CS is separately shown in the drawing to represent that the volatile memory devices 410_0 and 410_1 share the same chip select signal CS. The address ADDR may include a plurality of addresses. For example, the address ADDR may include a multi-bit bank group address, a multi-bit bank address and a multi-bit normal address. The clock CK may be transferred from the controller 400 to the volatile memory devices 410_0 and 410_1 for synchronized operations of the volatile memory devices 410_0 and 410_1. The clock CK may be transferred in a differential scheme including a clock (CK_t) and a clock bar (CK_c) acquired by inverting the clock (CK_t).

The data bus DATA_BUS may transfer multi-bit data DATA0 to DATA3 between the controller 400 and the volatile memory devices 410_0 and 410_1. The respective volatile memory devices 410_0 and 410_1 are provided with data pads DQ0 to DQ3 coupled with data lines DATA0 to DATA3 of the data bus DATA_BUS. The data lines DATA0 and DATA1 which have different numbers may be coupled to the data pads DQ0 of the respective volatile memory devices 410_0 and 410_1, which are specified among the data pads DQ0 to DQ3. The specified data pads DQ0 may be data pads which are used to set latencies for recognizing the control signals on the control bus CMD/ADDR_BUS.

The controller 400 may control the volatile memory devices 410_0 and 410_1 through the control bus CMD/ADDR_BUS, and may exchange data with the volatile memory devices 410_0 and 410_1 through the data bus DATA_BUS. The controller 400 may be provided in a dual in-line memory module (DIMM), may set latencies to different values for allowing the volatile memory devices 410_0 and 410_1 to recognize signals on the control bus CMD/ADDR_BUS, and may access a volatile memory device desired between the volatile memory devices 410_0 and 410_1, by using the latencies. This will be described below in detail with reference to FIGS. 5 to 7B.

The first volatile memory device 410_0 and the second volatile memory device 410_1 may share the control bus CMD/ADDR_BUS and the data bus DATA_BUS. The first volatile memory device 410_0 and the second volatile memory device 410_1 may also share the chip select signal CS. The first volatile memory device 410_0 and the second volatile memory device 410_1 may be set with different latencies for control signals to be transmitted through the control bus CMD/ADDR_BUS. A latency may mean the timing difference between the chip select signal CS serving as a reference for the latency and the remaining signals CMD and ADDR among signals on the control bus CMD/ADDR_BUS. Due to the fact that the first volatile memory device 410_0 and the second volatile memory device 410_1 are set with different latencies with respect to the control bus CMD/ADDR_BUS, the first volatile memory device 410_0 and the second volatile memory device 410_1 may be independently accessed by the controller 400, which will be described below in detail with reference to FIGS. 5 to 7B.

As may be seen from FIG. 4, signal transmission lines for identifying the first volatile memory device 410_0 and the second volatile memory device 410_1 are not separately allocated to the first volatile memory device 410_0 and the second volatile memory device 410_1. Nevertheless, the controller 400 may separately access the first volatile memory device 410_0 and the second volatile memory device 410_1, which will be described below.

Basic CAL Setting Operation of DIMM

Figure 5:
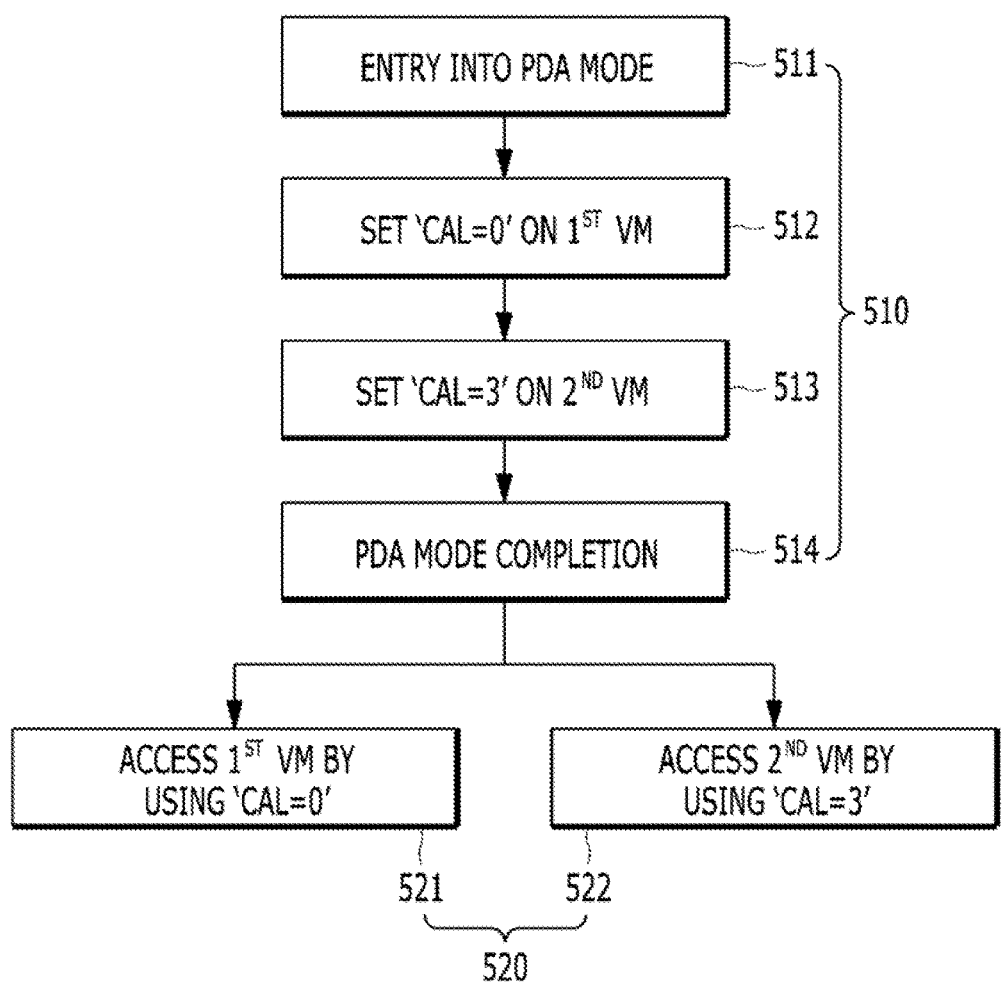
FIG. 5 is a flow chart Illustrating operations of the memory system shown in FIG. 4.

FIG. 5 is a flow chart illustrating operations of the memory system shown in FIG. 4.

Referring to FIG. 5, operations of the memory system may be divided into an operation 510 and an operation 520. The operation 510 is for the controller 400 to set differently latencies for control signals transmitted through the control bus CMD/ADDR_BUS of the first volatile memory device 410_0 and the second volatile memory device 410_1. The operation 520 is for the controller 400 to separately access the first volatile memory device 410_0 and the second volatile memory device 410_1.

First, the controller 400 may control the first volatile memory device 410_0 and the second volatile memory device 410_1 to enter a per-DRAM addressability (PDA) mode (operation 511). This may be implemented by applying the command CMD as a combination corresponding to a mode register set command (MRS) and applying the address ADDR as a combination corresponding to entry to the PDA mode.

After entry to the PDA mode, the latency, corresponding to the control bus CMD/ADDR_BUS, of the first volatile memory device 410_0, that is, the command address latency CAL of the first volatile memory (VM) device 410_0 may be set to '0' (operation 512). This may be implemented by applying the command CMD as the combination corresponding to the mode register set command (MRS), applying the address ADDR as a combination corresponding to setting of the CAL to '0' and applying the signal of the zeroth data line DATA0 corresponding to the zeroth data pad DQ0 of the first volatile memory device 410_0, as the level of '0,' after a write latency WL (WL=AL+CWL) passes from the application time of the command CMD.

Figure 6:
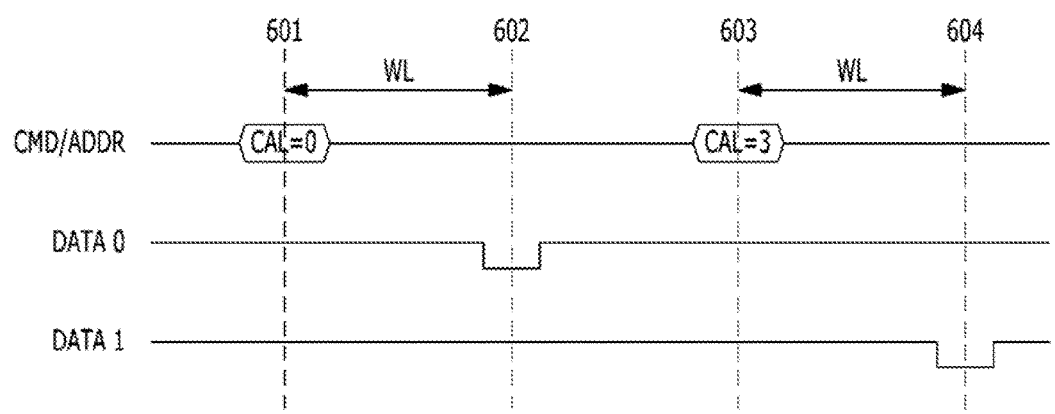
FIG. 6 is a timing diagram illustrating operations 512 and 513 of FIG. 5.

Referring to FIG. 6, the command/address CMD/ADDR for setting the CAL to '0' are applied at a point of time 601 and the data line DATA0 has the level of '0' at a point of time 602 when a time corresponding to the write latency WL passes from the point of time 601. Since the data line DATA1 has the level of '1' at the point of time 602, the second volatile memory device 410_1 neglects the command CMD applied at the point of time 601.

Referring again to FIG. 5, the latency, corresponding to the control bus CMD/ADDR_BUS, of the second volatile memory (VM) device 410_1, that is, the command address latency (CAL) of the second volatile memory device 410_1 may be set to '3' (operation 513). This may be implemented by applying the command CMD as the combination corresponding to the mode register set command (MRS), applying the address ADDR as a combination corresponding to setting of the CAL to '3' and applying the signal of the first data line DATA1 corresponding to the zeroth data pad DQ0 of the second volatile memory device 410_1, as the level of '0,' after the write latency WL (WL=AL+CWL) passes from the application time of the command CMD.

Referring again to FIG. 6, it may be confirmed that the command/address CMD/ADDR for setting the CAL to '3' are applied at a point of time 603 and the data line DATA1 has the level of '0' at a point of time 604 when a time corresponding to the write latency WL passes from the point of time 603. Since the data line DATA0 has the level of '1' at the point of time 604, the first volatile memory device 410_0 neglects the command CMD applied at the point of time 603.

Referring again to FIG. 5, if the latency setting of the volatile memory devices 410_0 and 410_1 is completed, the PDA mode may be ended (operation 514).

Since the command address latencies CAL of the first volatile memory device 410_0 and the second volatile memory device 410_1 are set differently from each other, the controller 400 may access the first volatile memory device 410_0 by applying the command/address CMD/ADDR at the enable time of the chip select signal CS (operation 521) or may access the second volatile memory device 410_1 by applying the command/address CMD/ADDR after 3clocks from the enable time of the chip select signal CS (operation 522). FIGS. 7A and 7B are timing diagrams representing the operations 521 and 522 of FIG. 5.

Referring to FIGS. 7A and 7B, the command CMD applied at points of time 701, 703, 705, 707, 709 and 711 the same as the enable times of the chip select signal CS is recognized by the first volatile memory device 410_0 and operates the first volatile memory device 410_0, and the command CMD applied at points of time 702, 704, 706, 708, 710 and 712 after 3clocks from the enable times of the chip select signal CS is recognized by the second volatile memory device 410_1 and operates the second volatile memory device 410_1. In the drawings, the reference symbol NOP represents a non-operation state in which any operation is not instructed. As in the operations at the points of time 701, 702, 703, 704, 707, 708, 709 and 710, it is possible to access only one volatile memory device of the first volatile memory device 410_0 and the second volatile memory device 410_1. As in the operations at the points of time 705, 706, 711 and 712, by not only applying the valid command CMD at the enable times of the chip select signal CS but also applying the valid command CMD after 3clocks from the enable times of the chip select signal CS, it may be possible to access both the first volatile memory device 410_0 and the second volatile memory device 410_1.

According to the embodiment described above with reference to FIGS. 4 to 7B, the volatile memory devices 410_0 and 410_1 share the control bus CMD/ADDR_BUS and the data bus DATA_BUS, but have different latencies with respect to the control bus CMD/ADDR_BUS. The controller 400 may access a volatile memory device which is desired to access, between the volatile memory devices 410_0 and 410_1, by changing the latency of signals applied through the control bus CMD/ADDR_BUS. Therefore, it is not necessary for any line to be added in order to independently control the volatile memory devices 410_0 and 410_1.

Although it was exemplified in the above embodiment that the volatile memory devices 410_0 and 410_1 are set by the controller 400 to have different latencies with respect to the control bus CMD/ADDR_BUS, this is for an illustration purpose only and it is to be noted that the volatile memory devices 410_0 and 410_1 may be programmed to have permanently different latencies. For example, the latencies of the volatile memory devices 410_0 and 410_1 with respect to the control bus CMD/ADDR_BUS may be fixed when fabricating the volatile memory devices 410_0 and 410_1. For another example, the latencies of the volatile memory devices 410_0 and 410_1 with respect to the control bus CMD/ADDR_BUS may be fixed through a permanent setting for example, a setting using a fuse circuit, after fabrication of the volatile memory devices 410_0 and 410_1.

Furthermore, the difference in the values of command address latencies CAL between the volatile memory devices 410_0 and 410_1 may be equal to or greater than a row address to column address delay time tRCD (RAS to CAS delay). Additionally, the difference in the values of command address latencies CAL between the volatile memory devices 410_0 and 410_1 may be less than a row precharge time tRP. That is, dCAL (CAL difference)≥tRCD, and dCAL<tRP.

Figure 8:
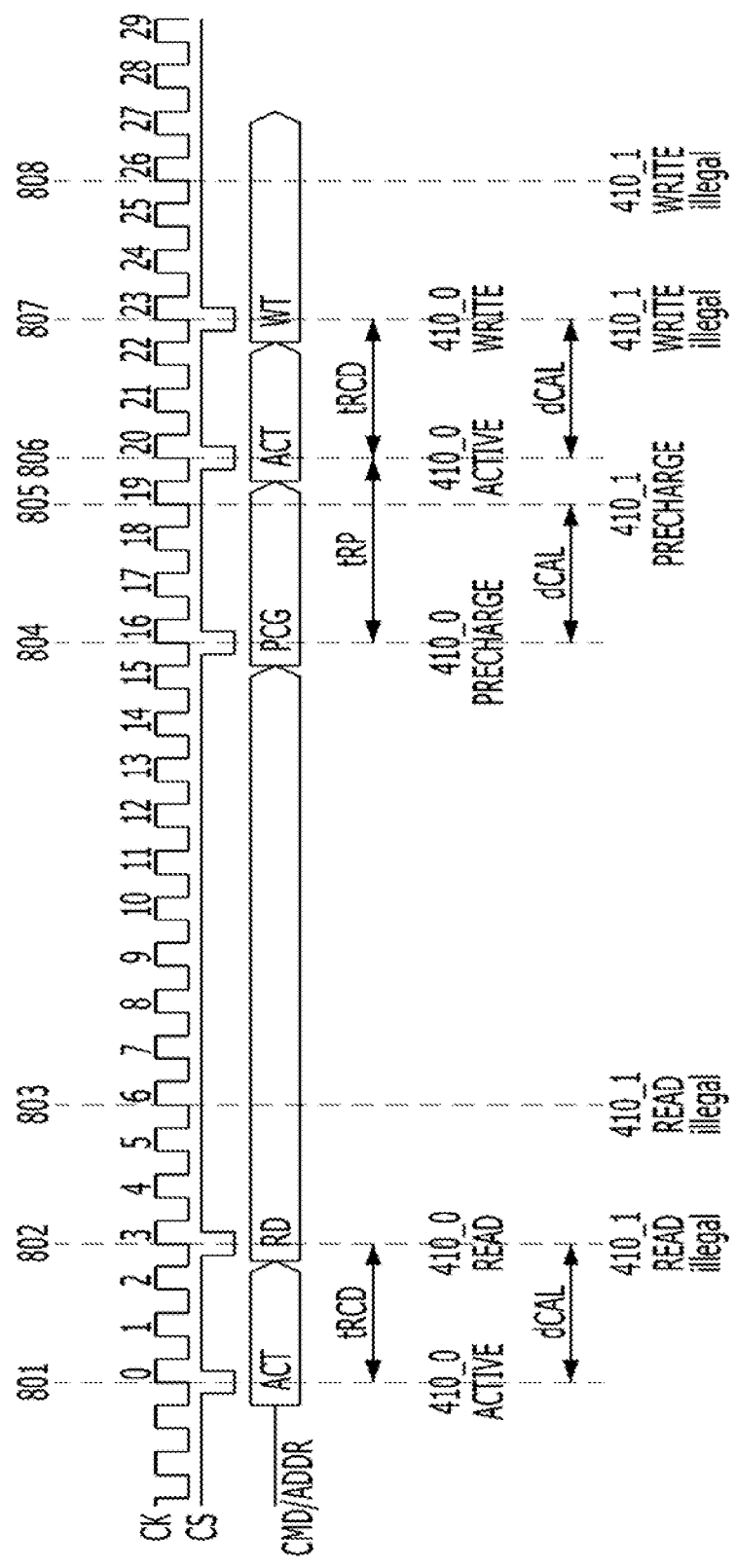
FIG. 8 is a timing diagram for describing advantages when a difference dCAL in the values of command address latencies CAL of volatile memory devices 410_0 and 410_1 is equal to or larger than a tRCD and smaller than a tRP.

FIG. 8 is a diagram for describing advantages when the difference dCAL in the values of command address latencies CAL of the volatile memory devices 410_0 and 410_1 is equal to or greater than the tRCD and less than the tRP. With reference to FIG. 8, descriptions will be made on the presumption that dCAL=3 as the first volatile memory device 410_0 has CAL=0 and the second volatile memory device 410_1 has CAL=3, tRCD=3 and tRP=4.

Referring to FIG. 8, at a point of time 801, the chip select signal CS may be enabled, and an active operation ACT may be instructed by the command/address CMD/ADDR. Then, the first volatile memory device 410_0 may perform an active operation by recognizing the active operation ACT at the point of time 801.

At a point of time 802, the chip select signal CS may be enabled, and a read operation RD may be instructed by the command/address CMD/ADDR. Then, the first volatile memory device 410_0 may perform a read operation by recognizing the read operation RD at the point of time 802. At the point of time 802 when 3 clocks pass after the chip select signal CS is enabled at the point of time 801, the second volatile memory device 410_1 may recognize the read operation RD from the command/address CMD/ADDR.

However, since an active operation had not been performed in the second volatile memory device 410_1, the second volatile memory device 410_1 may determine the read operation RD instructed by the command/address CMD/ADDR, as illegal, and may not perform a read operation. If dCAL is less than tRCD, a mis-operation may occur as the second volatile memory device 410_1 recognizes the active operation ACT instructed to the first volatile memory device 410_0. Such a mis-operation may be prevented in the case where dCAL≥tRCD. Also, at a point of time 803 when 3 clocks pass after the chip select signal CS is enabled at the point of time 802, the second volatile memory device 410_1 may recognize the read operation RD from the command/address CMD/ADDR. However, since an active operation had not been performed in the second volatile memory device 410_1, the second volatile memory device 410_1 may determine the read operation RD instructed by the command/address CMD/ADDR, as illegal, and may not perform a read operation.

At a point of time 804, the chip select signal CS may be enabled, and a precharge operation PCG may be instructed by the command/address CMD/ADDR. Then, the first volatile memory device 410_0 may perform a precharge operation by recognizing the precharge operation PCG at the point of time 804. At a point of time 805 when 3 clocks pass after the chip select signal CS is enabled at the point of time 804, the second volatile memory device 410_1 may recognize the precharge operation PCG from the command/address CMD/ADDR and may perform a precharge operation. Since a precharge operation does not consider whether an active operation has previously been performed, the precharge operation may be performed even by the second volatile memory device 410_1.

At a point of time 806, the chip select signal CS may be enabled, and an active operation ACT may be instructed by the command/address CMD/ADDR. Then, the first volatile memory device 410_0 may perform an active operation by recognizing the active operation ACT at the point of time 806. If dCAL is set to be greater than tRP, a mis-operation may occur as the second volatile memory device 410_1 recognizes the active operation ACT instructed through the command/address CMD/ADDR and performs an active operation, from the point of time 806. Such a mis-operation may be prevented since dCAL<tRP.

At a point of time 807, the chip select signal CS may be enabled, and a write operation WT may be instructed by the command/address CMD/ADDR. Then, the first volatile memory device 410_0 may perform a write operation by recognizing the write operation WT at the point of time 807. At the point of time 807 when 3 clocks pass after the chip select signal CS is enabled at the point of time 806, the second volatile memory device 410_1 may recognize the write operation WT from the command/address CMD/ADDR. However, since an active operation had not been performed in the second volatile memory device 410_1, the second volatile memory device 410_1 may determine the write operation WT instructed by the command/address CMD/ADDR, as illegal, and may not perform a write operation. At a point of time 808 when 3 clocks pass after the chip select signal CS is enabled at the point of time 807, the second volatile memory device 410_1 may recognize the write operation WT from the command/address CMD/ADDR. However, since an active operation had not been performed in the second volatile memory device 410_1, the second volatile memory device 410_1 may determine the write operation WT instructed by the command/address CMD/ADDR, as illegal, and may not perform a write operation.

As described above with reference to FIG. 8, by setting the command address latencies CAL of the volatile memory devices 410_0 and 410_1 in such a way as to satisfy dCAL (CAL difference)≥tRCD and dCAL<tRP, it is possible to prevent the volatile memory devices 410_0 and 410_1 from performing mis-operations.

Configuration and Operation of NVDIMM

Figure 9:
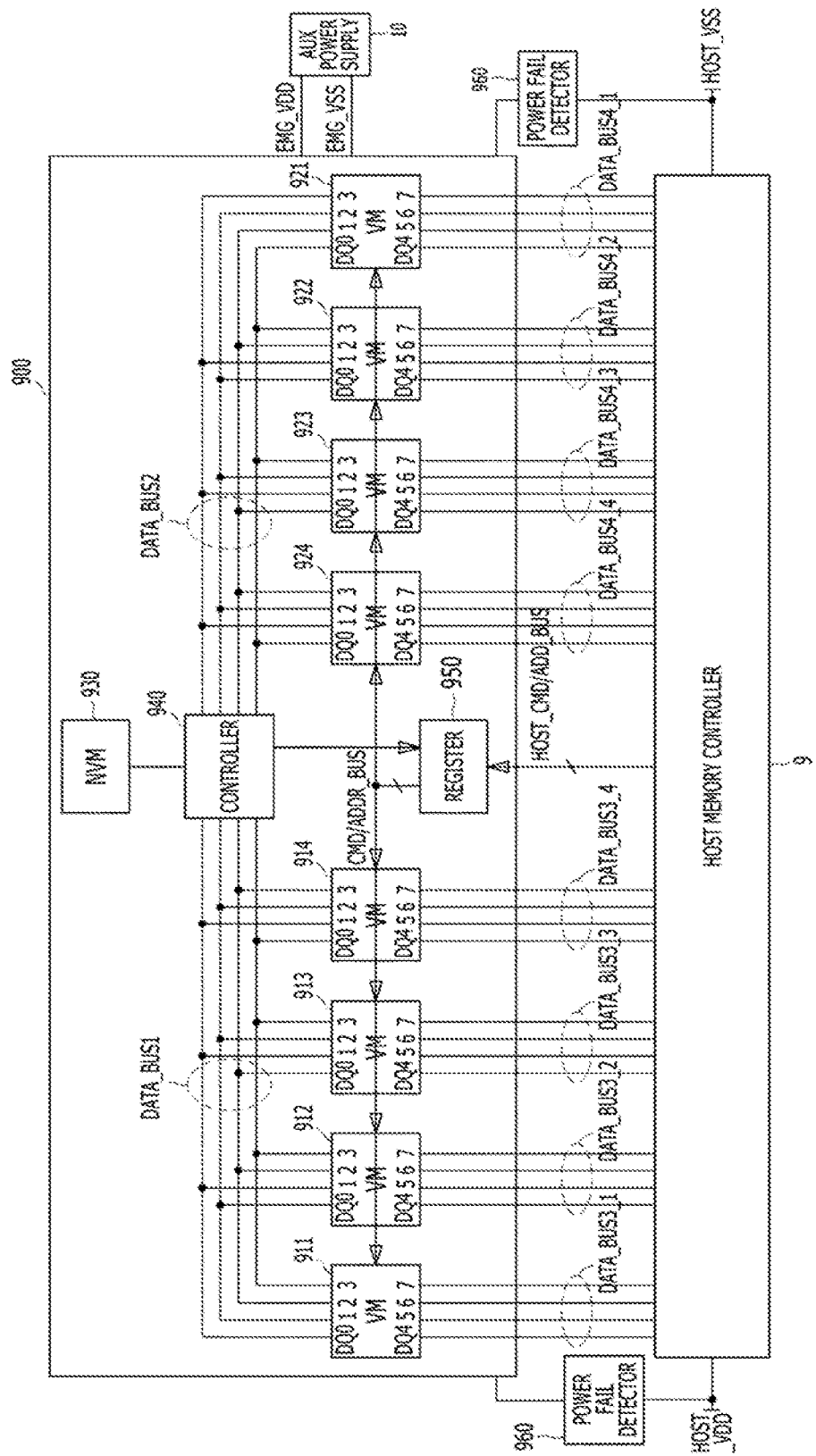
FIG. 9 is a diagram illustrating a nonvolatile dual in-line memory module (NVDIMM) in accordance with an embodiment.

FIG. 9 is a diagram Illustrating a nonvolatile dual in-line memory module (NVMIMM) 900 in accordance with an embodiment. In FIG. 9, descriptions will be made for an example in which the scheme of setting differently the command address latencies CAL of volatile memory devices and accessing independently the volatile memory devices sharing a data bus and a control bus is applied to the NVDIMM 900 in accordance with the embodiment. In FIG. 9, a memory controller 9 of a host and an auxiliary power supply 10 which construct an NVDIMM memory system are shown together. The NVDIMM 900 is a memory module which prevents data from being lost upon occurrence of a power fail, through an operation of backing up data of volatile memory devices in a nonvolatile memory device when power of the host is unstable. The term VM represents a volatile memory, and the term NVM represents a nonvolatile memory.

Referring to FIG. 9, the NVDIMM 900 may include a plurality of first volatile memory devices 911 to 914, a plurality of second volatile memory (VM) devices 921 to 924, a nonvolatile memory (NVM) device 930, a controller 940, a register 950, a power fall detector 960, a first data bus DATA_BUS1, a second data bus DATA_BUS2, a control bus CMD/ADDR_BUS, a plurality of third data buses DATA_BUS3_1 to DATA_BUS3_4, and a plurality of fourth data buses DATA_BUS4_1 to DATA_BUS4_4.

When power HOST_VDD and HOST_VSS of the host is normal, the register 950 may buffer a command, an address and a clock provided through a host control bus HOST_CMD/ADDR_BUS from the memory controller 9 of the host, and may provide the command, the address and the clock to the first volatile memory devices 911 to 914 and the second volatile memory devices 921 to 924 through the control bus CMD/ADDR_BUS. When the power HOST_VDD and HOST_VSS of the host is normal, the first volatile memory devices 911 to 914 may transmit/receive data to/from the memory controller 9 of the host by using the third data buses DATA_BUS3_1 to DATA_BUS3_4 respectively corresponding thereto, and the second volatile memory devices 921 to 924 may transmit/receive data to/from the memory controller 9 of the host by using the fourth data buses DATA_BUS4_1 to DATA_BUS4_4 respectively corresponding thereto. That is, when the power HOST_VDD and HOST_VSS of the host is normal, the first volatile memory devices 911 to 914 and the second volatile memory devices 921 to 924 may communicate with the memory controller 9 of the host by using independent data buses corresponding thereto among the third data buses DATA_BUS3_1 to DATA_BUS3_4 and the fourth data buses DATA_BUS4_1 to DATA_BUS4_4.

When the power fail detector 960 detects a fail in the power HOST_VDD and HOST_VSS of the host, that is, the levels of voltages forming the power HOST_VDD and HOST_VSS of the host become unstable, the supply of the power HOST_VDD and HOST_VSS of the host to the NVDIMM 900 is interrupted. Then, emergency power EMG_VDD and EMG_VSS of the auxiliary power supply 10 is supplied to the NVDIMM 900. The auxiliary power supply 10 may be implemented by using a large capacity capacitor, for example, a super capacitor, and may supply the emergency power EMG_VDD and EMG_VSS while the data of the first volatile memory devices 911 to 914 and the second volatile memory devices 921 to 924 are backed up in the nonvolatile memory device 930. While it is illustrated in FIG. 9 that the auxiliary power supply 10 is disposed outside the NVDIMM 900, the auxiliary power supply 10 may also be disposed inside the NVDIMM 900. Furthermore, when a fail in the power HOST_VDD and HOST_VSS of the host is detected, the power fail detector 960 may notify the controller 940 of the fail.

When the fall in the power HOST_VDD and HOST_VSS of the host is notified from the power fail detector 960, control over the first volatile memory devices 911 to 914 and the second volatile memory devices 921 to 924 is converted from the memory controller 9 of the host to the controller 940 of the NVDIMM 900. The register 950 may buffer a command, an address and a clock provided from the controller 940 not the memory controller 9 of the host, and may provide the command, the address and the clock to the first volatile memory devices 911 to 914 and the second volatile memory devices 921 to 924 through the control bus CMD/ADDR_BUS. The first volatile memory devices 911 to 914 may exchange data with the controller 940 by using the first data bus DATA_BUS1, and the second volatile memory devices 921 to 924 may exchange data with the controller 940 by using the second data bus DATA_BUS2. The controller 940 may read the data of the first volatile memory devices 911 to 914 and the second volatile memory devices 921 to 924 by using the control bus CMD/ADDR_BUS, the first data bus DATA_BUS1 and the second data bus DATA_BUS2, respectively, and may store that is, back up the read data in the nonvolatile memory device 930.

The data of the first volatile memory devices 911 to 914 and the second volatile memory devices 921 to 924 backed up in the nonvolatile memory device 930 upon occurrence of the fall in the power HOST_VDD and HOST_VSS of the host may be transmitted to and stored in the first volatile memory devices 911 to 914 and the second volatile memory devices 921 to 924 after the power HOST_VDD and HOST_VSS of the host returns to a normal state. Such a restoration operation may be performed according to control of the controller 940, and, after the restoration is completed, control over the first volatile memory devices 911 to 914 and the second volatile memory devices 921 to 924 may be converted from the controller 940 of the NVDIMM 900 to the memory controller 9 of the host.

Between the controller 940 and the first volatile memory devices 911 to 914, there exist only the control bus CMD/ADDR_BUS and the first data bus DATA_BUS1. That is, all the first volatile memory devices 911 to 914 share the same control bus and data bus in communication with the controller 940. Similarly, between the controller 940 and the second volatile memory devices 921 to 924, there exist only the control bus CMD/ADDR_BUS and the second data bus DATA_BUS2. That is, all the second volatile memory devices 921 to 924 share the same control bus and data bus in communication with the controller 940. Nevertheless, the controller 940 may independently access an individual volatile memory device among the first volatile memory devices 911 to 914, and may independently access an individual volatile memory device among the second volatile memory devices 921 to 924. In this regard, descriptions were made above with reference to FIGS. 2 to 8 in connection with the configuration and the operation of the NVDIMM 900 which shares the control bus CMD/ADDR_BUS and the data bus DATA_BUS. With regard to independent operations associated with data backup and restoration in an NVDIMM, descriptions will be made later with reference to FIGS. 11 and 12.

The first volatile memory devices 911 to 914 and the second volatile memory devices 921 to 924 may be dynamic random access memories (DRAMs) or may be not only DRAMs but also different kinds of volatile memory devices. The nonvolatile memory device 930 may be a NAND flash. However, the nonvolatile memory device 930 is not limited to such, and may be any kind of nonvolatile memory device such as a NOR flash, a resistive random access memory (RRAM), a phase RAM (PRAM), a magnetic RAM (MRAM) or a spin transfer torque MRAM (STT-MRAM).

The components in the NVDIMM 900 shown in FIG. 9 may be incorporated with or separated from one another. For example, the controller 940, the register 950 and the power fall detector 960 may be configured as one chip or may be configured as multiple chips. Furthermore, the numbers of the first volatile memory devices 911 to 914, the second volatile memory devices 921 to 924 and the nonvolatile memory device 930 used in the NVDIMM 900 may be different from the illustration of FIG. 9.

Figure 10:
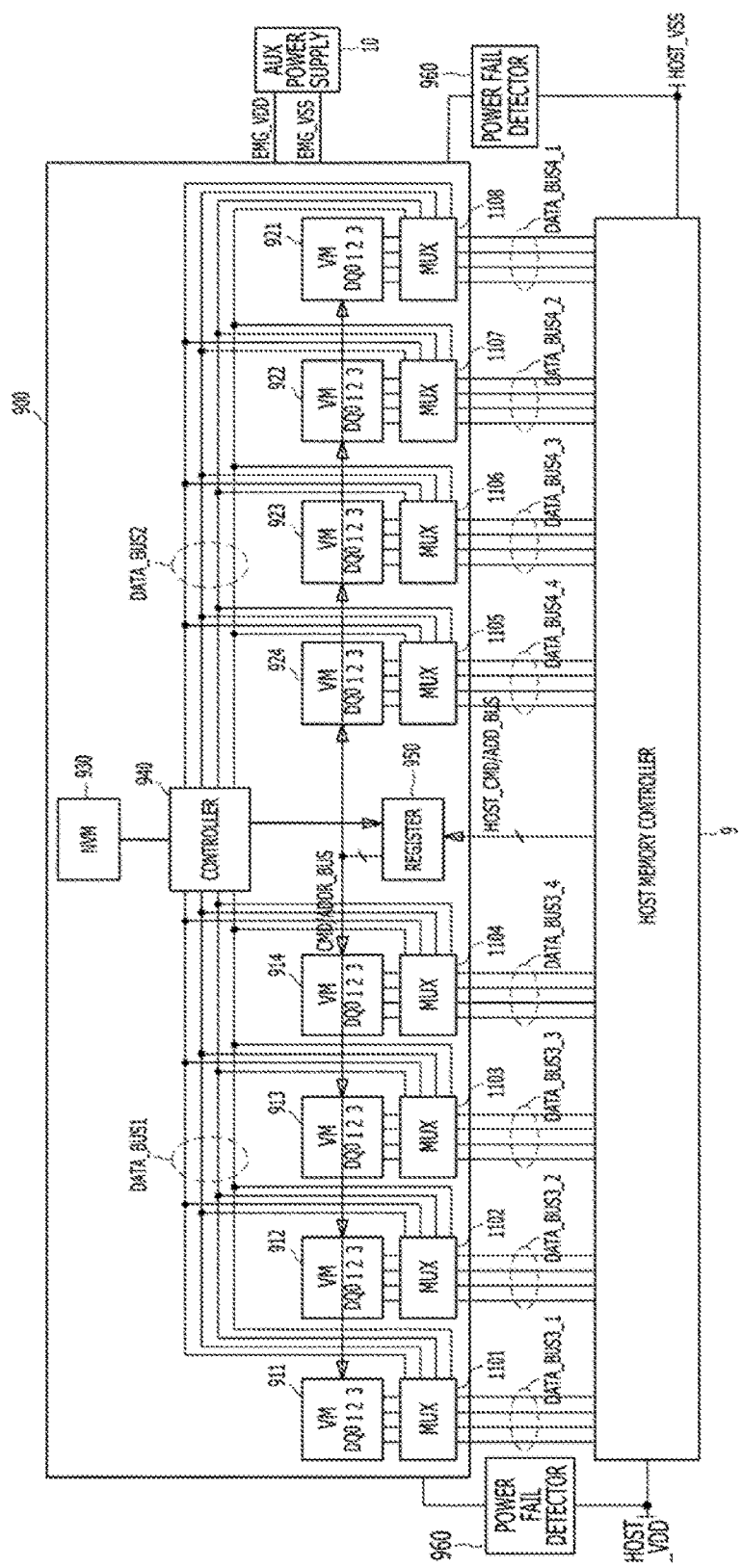
FIG. 10 is a diagram illustrating a nonvolatile dual in-line memory module (NVDIMM) in accordance with another embodiment.

FIG. 10 is a configuration diagram illustrating a nonvolatile dual in-line memory module (NVDIMM) 900 in accordance with another embodiment.

In FIG. 10, when compared to FIG. 9, multiplexers 1101 to 1108 may be added and 4 data pads DQ0 to DQ3 may be used in each of the first volatile memory devices 911 to 914 and the second volatile memory devices 921 to 924. The term VM represents a volatile memory, and the term NVM represents a nonvolatile memory.

By the multiplexers 1101 to 1104, the data pads DQ0 to DQ3 of the first volatile memory devices 911 to 914 and the third data buses DATA_BUS3_1 to DATA_BUS3_4 may be coupled when the first volatile memory devices 911 to 914 communicate with the memory controller 9 of the host, and the data pads DQ0 to DQ3 of the first volatile memory devices 911 to 914 and the first data bus DATA_BUS1 may be coupled when the first volatile memory devices 911 to 914 communicate with the controller 940.

By the multiplexers 1105 to 1108, the data pads DQ0 to DQ3 of the second volatile memory devices 921 to 924 and the fourth data buses DATA_BUS4_1 to DATA_BUS4_4 may be coupled when the second volatile memory devices 921 to 924 communicate with the memory controller 9 of the host, and the data pads DQ0 to DQ3 of the second volatile memory devices 921 to 924 and the second data bus DATA_BUS2 may be coupled when the second volatile memory devices 921 to 924 communicate with the controller 940.

Since the NVDIMM 900 of FIG. 10 operates in the same manner as described above with reference to FIG. 9 except that the multiplexers 1101 to 1108 are added and the 4 data pads DQ0 to DQ3 are used in each of the first volatile memory devices 911 to 914 and the second volatile memory devices 921 to 924, further detailed descriptions will be omitted herein.

Power-Down Backup Operation

Figure 11:
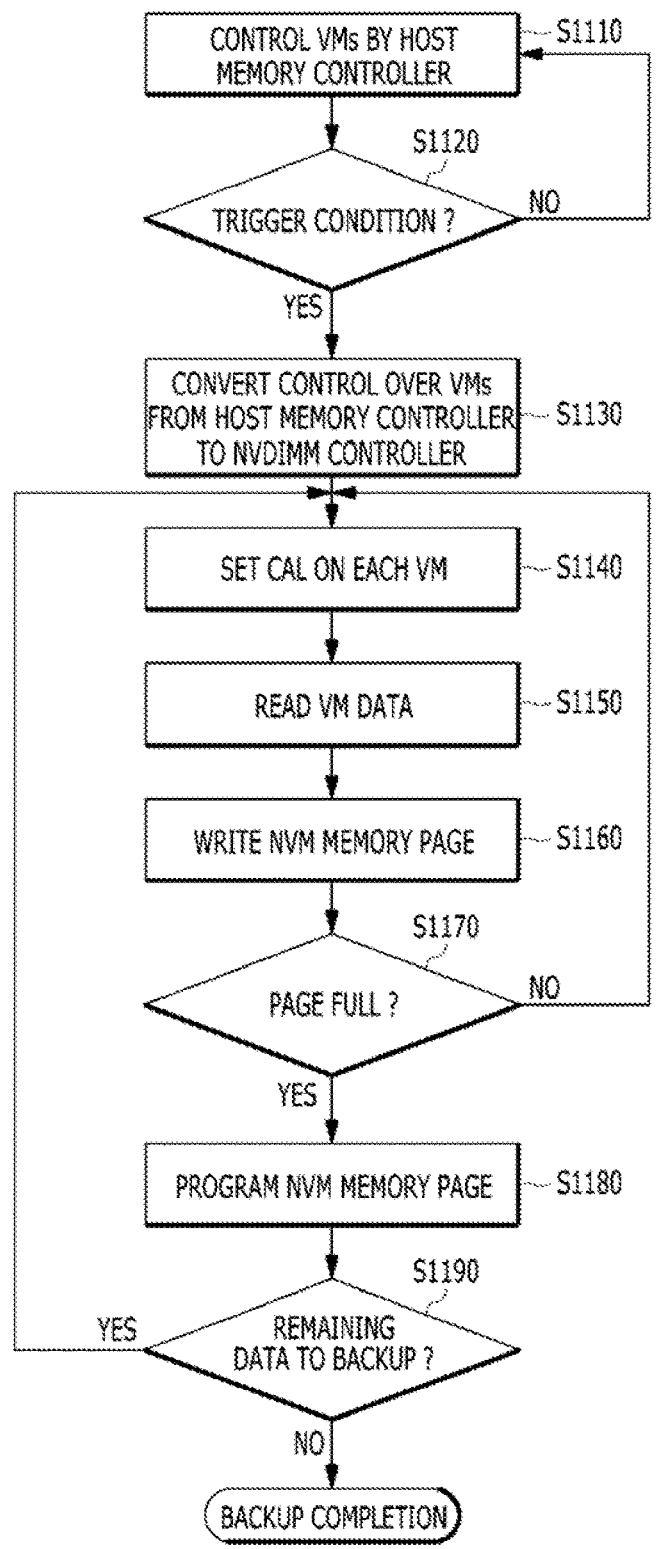
FIG. 11 is a flow chart illustrating a backup operation in a nonvolatile dual in-line memory module (NVDIMM) in accordance with the embodiment.

FIG. 11 is a flow chart illustrating a backup operation in a nonvolatile dual in-line memory module (NVDIMM) in accordance with the embodiment. In FIG. 11, the term VM represents a volatile memory, and the term NVM represents a nonvolatile memory.

Referring to FIG. 11, in the NVDIMM 900 illustrated in FIG. 9, the first volatile memory devices 911 to 914 and the second volatile memory devices 921 to 924 communicate with the memory controller 9 of the host at a normal time, and control over the volatile memory devices 911 to 914 and 921 to 924 is performed by the memory controller 9 of the host (step S1110). While the first volatile memory devices 911 to 914 and the second volatile memory devices 921 to 924 share the same control bus CMD/ADDR_BUS, the data buses DATA_BUS3_1 to DATA_BUS3_4 and DATA_BUS4_1 to DATA_BUS4_4 are provided independently for the volatile memory devices 911 to 914 and 921 to 924. Therefore, unlike the controller 940 of the NVDIMM 900, the memory controller 9 of the host may transmit/receive different data independently to/from the volatile memory devices 911 to 914 and 921 to 924.

At step S1120, a trigger condition may be satisfied. If the trigger condition is satisfied, the process may proceed to step S1130. If the trigger condition is not satisfied, the process may proceed to step S1110. The trigger condition is a condition for backing up the data of the first volatile memory devices 911 to 914 and the second volatile memory devices 921 to 924 in the nonvolatile memory device 930. For example, detection of a fail in the power HOST_VDD and HOST_VSS of the host may satisfy the trigger condition. Alternatively, when a backup operation is performed by the instruction of the memory controller 9 of the host, instruction of the backup operation by the memory controller 9 of the host may satisfy the trigger condition.

At step S1130, control over the volatile memory devices 911 to 914 and 921 to 924 may be converted from the memory controller 9 of the host to the controller 940 of the NVDIMM 900. Further, power used by the NVDIMM 900 is converted from the power HOST_VDD and HOST_VSS of the host to the emergency power EMG_VDD and EMG_VSS supplied by the auxiliary power supply 10. Moreover, as a control subject is converted to the controller 940, a data bus used by the first volatile memory devices 911 to 914 is converted from the third data buses DATA_BUS3_1 to DATA_BUS3_4 to the first data bus DATA_BUS1, and a data bus used by the second volatile memory devices 921 to 924 is converted from the fourth data buses DATA_BUS4_1 to DATA_BUS4_4 to the second data bus DATA_BUS2.

At step S1140, the controller 940 sets command address latencies CAL independently on the volatile memory devices 911 to 914 and 921 to 924 which share the control bus CMD/ADDR_BUS and the data buses DATA_BUS1 and DATA_BUS2.

Referring again to FIG. 9, the respective first volatile memory devices 911 to 914 and the respective second volatile memory devices 921 to 924 include 8 data pads DQ0 to DQ7. Among the data pads DQ0 to DQ7, 4 data pads DQ0 to DQ3 may be coupled with the first data bus DATA_BUS1 and the second data bus DATA_BUS2, and 4 remaining data pads DQ4 to DQ7 may be coupled with the third data buses DATA_BUS3_1 to DATA_BUS3_4 and the fourth data buses DATA_BUS4_1 to DATA_BUS4_4. Data buses used by the first volatile memory devices 911 to 914 and the second volatile memory devices 921 to 924 may be changed by the instruction of the controller 940. The zeroth data pads DQ0 of the first volatile memory devices 911 to 914 may be respectively coupled with different data lines among data lines which construct the first data bus DATA_BUS1, and the zeroth data pads DQ0 of the second volatile memory devices 921 to 924 may be respectively coupled with different data lines among data lines which construct the second data bus DATA_BUS2. Through this, the first volatile memory devices 911 to 914 may independently enter the PDA mode, and the second volatile memory devices 921 to 924 may independently enter the PDA mode.

For example, this may be achieved by setting the command address latency CAL of the first volatile memory device 911 and the second volatile memory device 921 hereinafter, referred to as a first volatile memory group to a first value for example, 0 and by setting the command address latency CAL of the remaining volatile memory devices 912 to 914 and 922 to 924 that is, volatile memory devices excluding the first volatile memory group 911 and 921 to a second value for example, 3 which is different from the first value.

Referring again to FIG. 11, at step S1150, the controller 940 reads the first volatile memory group 911 and 921 by using the setting of the command address latency CAL. For example, the controller 400 may read the first volatile memory group 911 and 921 by accessing the first volatile memory group 911 and 921 of which command address latency CAL is set to the first value for example, 0, through applying the command/address CMD/ADDR at the enable time of the chip select signal CS. Since the remaining volatile memory devices 912 to 914 and 922 to 924 excluding the first volatile memory group 911 and 921 are set to the second value for example, 3 in the command address latency CAL thereof, the remaining volatile memory devices 912 to 914 and 922 to 924 determine a read command from the controller 940 as illegal and do not perform a read operation.

The scheme in which the controller 940 sets command address latencies CAL independently on the volatile memory devices 911 to 914 and 921 to 924 which share the control bus CMD/ADDR_BUS and the data buses DATA_BUS1 and DATA_BUS2, at the step S1140, and reads data by accessing only a volatile memory device or a volatile memory group that is, the first volatile memory group 911 and 921 in the above example which has a specified command address latency CAL, at the step S1150, may be understood from the descriptions made above with reference to FIGS. 4 to 7B. Furthermore, the difference dCAL between the first value and the second value of the command address latencies CAL may be set in such a way as to satisfy dCAL≥tRCD and dCAL<tRP.

At step S1160, backup of data is performed as the data read from volatile memory devices are written in the nonvolatile memory device 930. For example, the data read from the first volatile memory group 911 and 921 may be backed up in a memory page of the nonvolatile memory device 930.

At step S1170, determination is made for whether a nonvolatile memory page is full. If the nonvolatile memory page is not full (S1170, NO), the process may return to the step S1140.

For example, if data stored in the first volatile memory group 911 and 921 remains, as described above, the controller 940 may perform the read operation for the remaining data stored in the first volatile memory group 911 and 921, by setting the command address latency CAL of the first volatile memory group 911 and 921 to the first value for example, 0 and by setting the command address latency CAL of the remaining volatile memory devices 912 to 914 and 922 to 924 to the second value for example, 3, at the step S1140.

For another example, if all the data stored in the first volatile memory group 911 and 921 are backed up, at the step S1140, the controller 940 may set the command address latency CAL of the first volatile memory device 912 and the second volatile memory device 922 hereinafter, referred to as a second volatile memory group) to the first value for example, 0 and may set the command address latency CAL of the remaining volatile memory devices 911, 913, 914, 921, 923 and 924 that is, volatile memory devices excluding the second volatile memory group 912 and 922 to the second value for example, 3, different from the first value. Then, at the step S1150, the controller 940 may read the second volatile memory group 912 and 922 by using the setting of the command address latency CAL. Although not illustrated, the selective reading of the volatile memory devices 911 to 914 and 921 to 924 which share the control bus CMD/ADDR_BUS and the data buses DATA_BUS1 and DATA_BUS2, by using the setting of the command address latency CAL, may be applied by being extended from a first volatile memory group to an Nth (N is a natural number) volatile memory group.

When it is determined at the step S1170 that the nonvolatile memory page is full (S1170, YES), the process proceeds to step S1180 where the nonvolatile memory page is programmed.

While programming the memory page of the nonvolatile memory device 930, it is necessary to check whether data not read from the volatile memory devices 911 to 914 and 921 to 924 still exists. Therefore, during the operation of programming the memory page of the nonvolatile memory device 930, the controller 940 may perform a refresh operation for the volatile memory devices 911 to 914 and 921 to 924. For example, a distributed refresh operation of uniformly distributing a refresh cycle may be performed. The distributed refresh is to perform a refresh cycle at each predetermined period such that all rows are turned on before iterating a task, and a volatile memory device may be read or written when refresh is not performed.

While a new nonvolatile memory page is prepared and written, the volatile memory devices 911 to 914 and 921 to 924 may operate under a low power mode having a power lower than a power of a complete operation state. After the new nonvolatile memory page is prepared and written, when data to back up still remains in the volatile memory devices 911 to 914 and 921 to 924 and a memory page to program exists in the nonvolatile memory device 930, the volatile memory devices 911 to 914 and 921 to 924 are recovered to the power mode of the complete operation state such that the operation of reading data not backed up is performed continuously.

At step S1190, determination is made for whether data to back up remains in the volatile memory devices 911 to 914 and 921 to 924. If data to back up does not exist, the power-down backup operation may be completed, and the NVDIMM 900 may be shut down. If data to back up remains, the process may proceed to the step S1140, and the backup operation for the remaining data is performed.

Power-Up Restoration Operation

Figure 12:
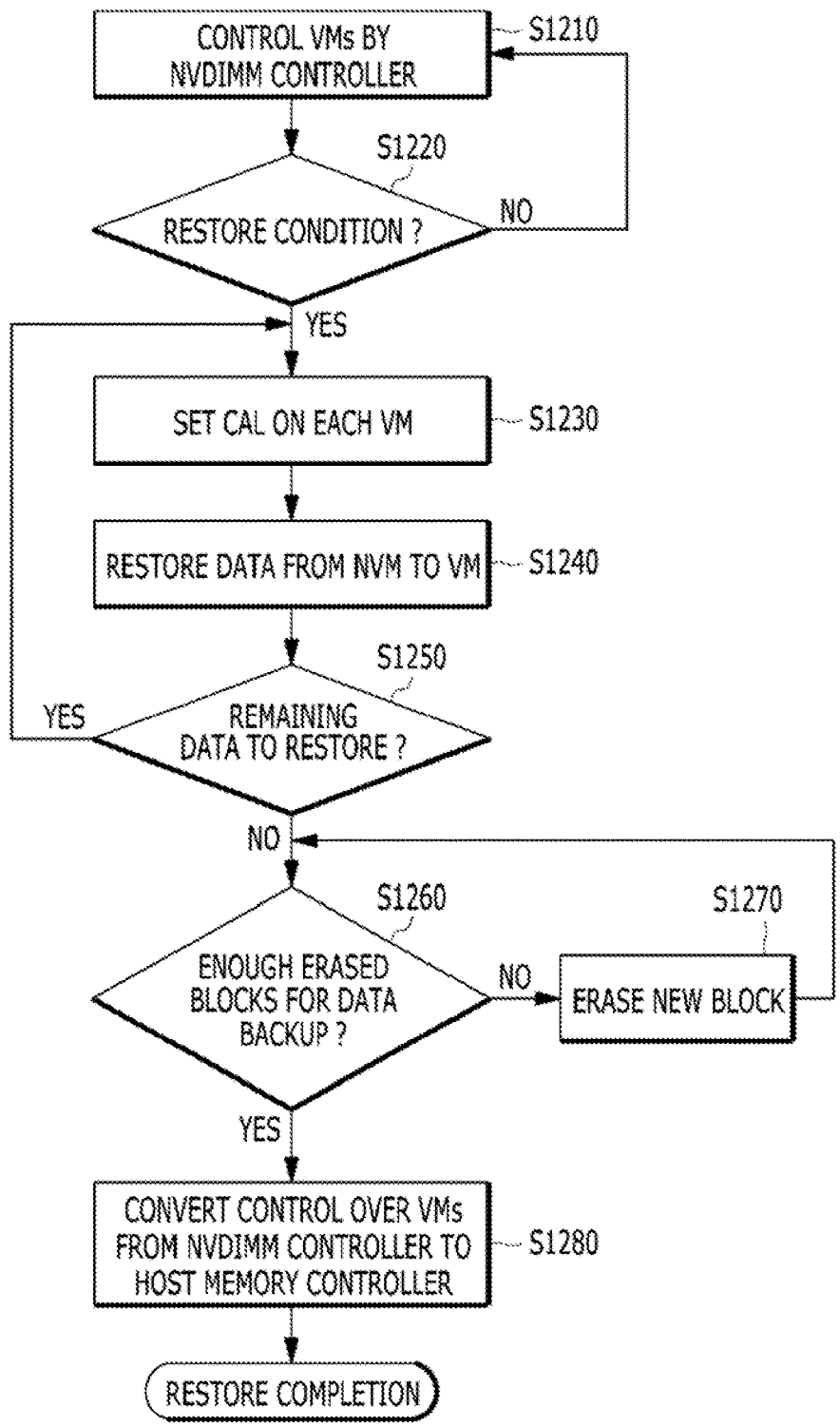
FIG. 12 is a flow chart illustrating a restoration operation in a nonvolatile dual in-line memory module (NVDIMM) in accordance with the embodiment.

FIG. 12 is a flow chart illustrating a restoration operation in a nonvolatile dual in-line memory module (NVDIMM) in accordance with the embodiment. In FIG. 12, the term VM represents a volatile memory, and the term NVM represents a nonvolatile memory.

A power-up restoration operation may be performed when the power HOST_VDD and HOST_VSS of the host returns to the normal state or as the memory controller 9 of the host instructs a restoration operation. Since the power HOST_VDD and HOST_VSS of the host has returned to the normal state, the power-up restoration operation may be performed by using the power HOST_VDD and HOST_VSS of the host.

In an example, the NVDIMM 900 may perform the restoration operation in the state in which the NVDIMM 900 is shut down after completing the backup operation by performing the power-down backup operation described above with reference to FIG. 11. In another example, while the NVDIMM 900 performs the backup operation, that is, before the backup operation is completed after it is started, the power HOST_VDD and HOST_VSS of the host may return to the normal state. In this case, the power-down backup operation may be interrupted, and the power-up restoration operation may be performed.

Referring to FIG. 12, in any example, the first volatile memory devices 911 to 914 and the second volatile memory devices 921 to 924 of the NVDIMM 900 may be in a state in which they are controlled by the controller 940 of the NVDIMM 900 (step S1210).

At step S1220, determination is made for whether a restoration condition is satisfied. When the restoration condition is satisfied (S1220, YES), restoration of data from the nonvolatile memory device 930 to the volatile memory devices 911 to 914 and 921 to 924 is started.

At step S1230, the controller 940 sets command address latencies CAL Independently on the volatile memory devices 911 to 914 and 921 to 924 which share the control bus CMD/ADDR_BUS and the data buses DATA_BUS1 and DATA_BUS2. As described above for the backup operation with reference to FIG. 11, the first volatile memory devices 911 to 914 may independently enter the PDA mode, and the second volatile memory devices 921 to 924 may independently enter the PDA mode.

For example, the command address latency CAL of the first volatile memory group 911 and 921 may be set to a third value for example, 0, and the command address latency CAL of the remaining volatile memory devices 912 to 914 and 922 to 924 may be set to a fourth value for example, 3 different from the third value.

At step S1240, the data read from the nonvolatile memory device 930 are written in the first volatile memory group 911 and 921 by using the command address latency CAL, by which data restoration to the first volatile memory group 911 and 921 may be performed.

At step S1250, a determination is made for whether data to restore remains in the nonvolatile memory device 930. When data to restore remains, the process may proceed to the step S1230, and the restoration operation may be performed for the remaining data.

For example, when data restoration for the first volatile memory group 911 and 921 is completed, at the step S1230, the controller 940 may set the command address latency CAL of the second volatile memory group 912 and 922 to the third value for example, 0 and may set the command address latency CAL of the remaining volatile memory devices 911, 913, 914, 921, 923 and 924 to the fourth value for example, 3 different from the third value. Then, at the step S1240, the controller 940 may restore the data read from the nonvolatile memory device 930, to the second volatile memory group 912 and 922, by using the setting of the command address latency CAL. The data restoration operation for the remaining volatile memory devices 913, 914, 923 and 924 excluding the first volatile memory group 911 and 921 and the second volatile memory group 912 and 922 may also be performed by setting the command address latency CAL of an Nth volatile memory group where N is a natural number, to the third value, setting the command address latency CAL of the remaining volatile memory devices that is, volatile memory devices excluding the Nth volatile memory group to the fourth value, and then restoring the data read from the nonvolatile memory device 930. The difference dCAL between the third value and the fourth value of the command address latency CAL may be set in such a way as to satisfy dCAL≥tRCD and dCAL<tRP.

When it is determined at the step S1250 that data to restore does not remain, the data restoration operation is substantially completed. However, to prepare for a case in which the power HOST_VDD and HOST_VSS of the host is down again, before control over the volatile memory devices 911 to 914 and 921 to 924 is converted to the memory controller 9 of the host, it is necessary to secure sufficient capacity that is, storage space of the nonvolatile memory device 930 to back up the data stored in the volatile memory devices 911 to 914 and 921 to 924.

At step S1260, a determination is made for whether erased blocks sufficient for data backup exist in the nonvolatile memory device 930. For example, a determination is made for whether erased blocks of an amount sufficient to back up the entire capacity of the volatile memory devices 911 to 914 and 921 to 924 or the used amount or the valid range of stored data of the volatile memory devices 911 to 914 and 921 to 924, exist in the nonvolatile memory device 930. If sufficient erased blocks do not exist in the nonvolatile memory device 930 (S1260, NO), a new block is erased in the nonvolatile memory device 930 (step S1270).

If sufficient erased blocks exist in the nonvolatile memory device 930 (S1260, YES), control over the volatile memory devices 911 to 914 and 921 to 924 is converted from the controller 940 of the NVDIMM 900 to the memory controller 9 of the host (step S1280), and the power-up restoration operation is completed.

Thereafter, the NVDIMM 900 may be used by the memory controller 9 of the host, and may operate in the same state as the step S1110 described above with reference to FIG. 11. For example, a data bus used by the first volatile memory devices 911 to 914 may be converted from the first data bus DATA_BUS1 to the third data buses DATA_BUS3_1 to DATA_BUS3_4, and a data bus used by the second volatile memory devices 921 to 924 may be converted from the second data bus DATA_BUS2 to the fourth data buses DATA_BUS4_1 to DATA_BUS4_4.

Power-Down Interrupt Operation

Figure 13:
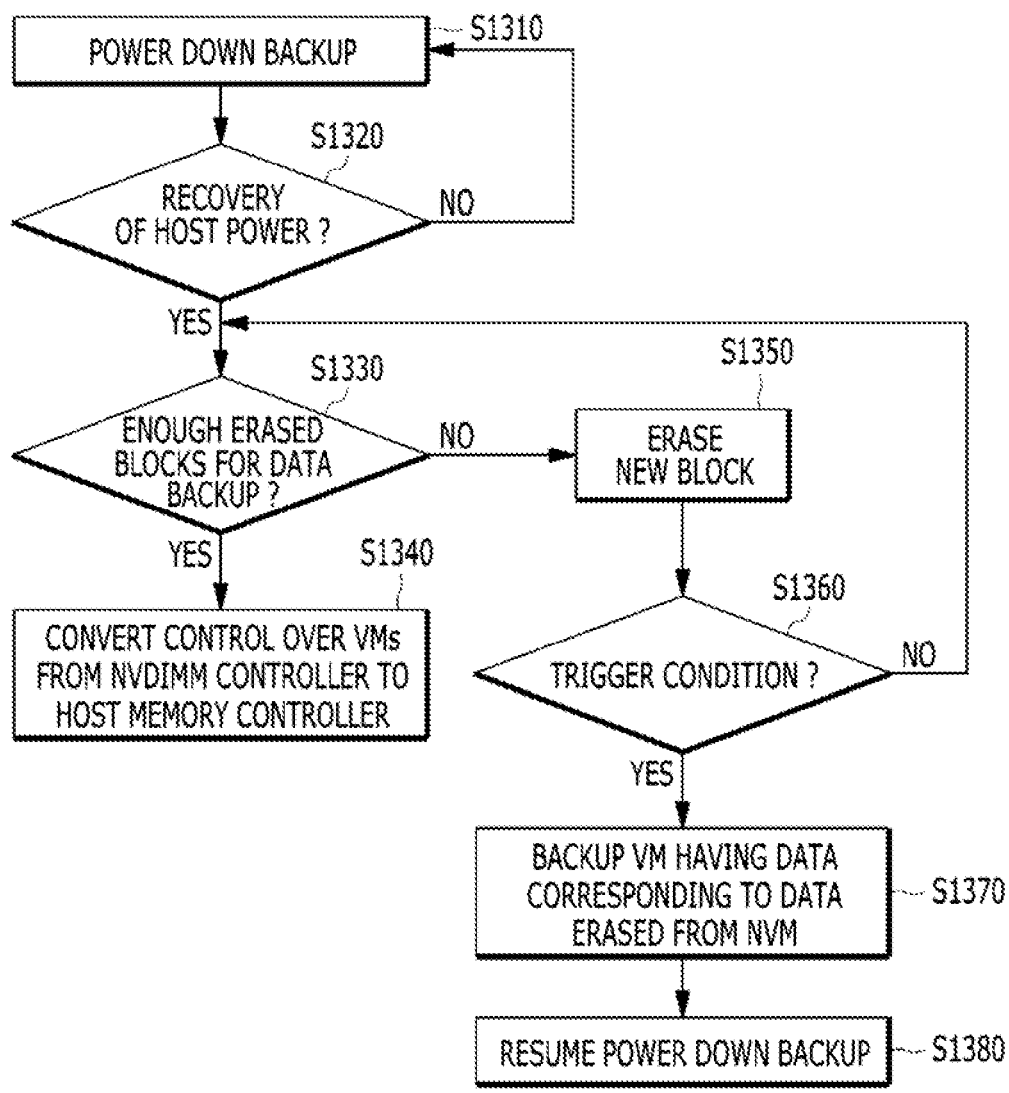
FIG. 13 is a flow chart illustrating a power-down interrupt operation in a nonvolatile dual in-line memory module (NVDIMM) in accordance with the embodiment.

FIG. 13 is a flow chart illustrating a power-down interrupt operation in a nonvolatile dual in-line memory module (NVDIMM) in accordance with the embodiment. In FIG. 13, the term VM represents a volatile memory, and the term NVM represents a nonvolatile memory.

When the power fail detector 960 detects occurrence of a fail in the power HOST_VDD and HOST_VSS of the host or the backup operation is instructed by the memory controller 9 of the host, the power-down backup operation is performed as described above with reference to FIG. 11. When performing the power-down backup operation, that is, before the backup operation is completed after it is started, the power HOST_VDD and HOST_VSS of the host may be recovered to the normal state and power supply from the host may be resumed. In this case, it is necessary to interrupt the backup operation and allow the volatile memory devices 911 to 914 and 921 to 924 of the NVDIMM 900 to be used by the memory controller 9 of the host as quickly as possible. Hereinbelow, descriptions will be made for such a power-down interrupt operation.

Referring to FIG. 13, at step S1310, the power-down backup operation described above with reference to FIG. 11, that is, the operation from when after a backup task is actually started as a trigger condition is satisfied to before the backup task is completed, is performed.

At step S1320, a determination is made for whether the power HOST_VDD and HOST_VSS of the host is recovered. For example, when the power HOST_VDD and HOST_VSS of the host returns to the normal state and is supplied to the NVDIMM 900 or a signal corresponding thereto is received from the memory controller 9 of the host, it may be determined that the power HOST_VDD and HOST_VSS of the host is recovered.

In the power-down interrupt operation, since the NVDIMM 900 has not completed the power-down backup operation yet, the NVDIMM 900 is in a state before being shut down, and the volatile memory devices 911 to 914 and 921 to 924 are in a state in which data are still stored therein. Therefore, the data restoration process as in the power-up restoration operation may not be necessary. However, since a memory page of the nonvolatile memory device 930 is programmed in the data backup process, it may not be able to prepare for a fall in the power HOST_VDD and HOST_VSS of the host, which may occur. Therefore, it may be necessary that, after securing a space of the nonvolatile memory device 930 capable of backing up the volatile memory devices 911 to 914 and 921 to 924 of the NVDIMM 900, control is converted to the memory controller 9 of the host.

At step S1330, a determination is made for whether erased blocks sufficient for data backup exist in the nonvolatile memory device 930. For example, a determination is made for whether erased blocks of an amount sufficient to back up the entire capacity of the volatile memory devices 911 to 914 and 921 to 924 or the used amount or the valid range of stored data of the volatile memory devices 911 to 914 and 921 to 924 exist in the nonvolatile memory device 930.

When sufficient erased blocks exist in the nonvolatile memory device 930 (S1330, YES), control over the volatile memory devices 911 to 914 and 921 to 924 is converted from the controller 940 of the NVDIMM 900 to the memory controller 9 of the host (step S1340), and the NVDIMM 900 may be immediately used by the memory controller 9 of the host.

However, if sufficient erased blocks do not exist in the nonvolatile memory device 930 (S1330, NO), a new block is erased in the nonvolatile memory device 930 to prepare for a fail in the power HOST_VDD and HOST_VSS of the host, which may occur (step S1350).

Here, the block erased from the nonvolatile memory device 930 may include the data backed up from the volatile memory devices 911 to 914 and 921 to 924. When a fail in the power HOST_VDD and HOST_VSS of the host occurs again during the power-down interrupt operation, instead of performing the entire power-down backup operation illustrated in FIG. 11 again from the start, it may be advantageous to preferentially back up only the data backed up in the erased block and then resume the backup operation interrupted at an interrupt time, in that a backup task may be quickly implemented and consumption of the emergency power EMG_VDD and EMG_VSS of the auxiliary power supply 10 which has a limited power amount may be reduced.

At step S1360, a determination is made for whether a trigger condition is satisfied. As described above, the trigger condition may be detection of a fail in the power HOST_VDD and HOST_VSS of the host or backup instruction from the memory controller 9 of the host. When the trigger condition is not satisfied, the process returns to the step S1330.

When it is determined that the trigger condition is satisfied (S1360, YES), at step S1370, a volatile memory region which has data corresponding to the data backed up in the erased block, is backed up in the nonvolatile memory device 930.

For example, when the data of the first volatile memory device 911 or the first volatile memory group 911 and 921 are backed up in the erased block of the nonvolatile memory device 930, the controller 940 of the NVDIMM 900 may set the command address latency CAL of the first volatile memory device 911 or the first volatile memory group 911 and 921 to a fifth value for example, 0. Then, after setting the command address latency CAL of the remaining volatile memory devices to a sixth value for example, 3, a volatile memory region which has data corresponding to the erased block of the nonvolatile memory device 930 may be selected and read by using the set value of the command address latency CAL. The read data are back up again in the nonvolatile memory device 930. After the selective backup operation of the step S1370 is completed, the power-down backup operation interrupted at the start time of the power-down interrupt operation may be resumed (step S1380).

As is apparent from the above descriptions, when the NVDIMM 900 performs backup and restoration operations of data by a fail and a recovery of the power HOST_VDD and HOST_VSS of the host, the first volatile memory devices 911 to 914 of the NVDIMM 900 shares the control bus CMD/ADDR_BUS and the first data bus DATA_BUS1 in communication with the controller 940, and the second volatile memory devices 921 to 924 of the NVDIMM 900 shares the control bus CMD/ADDR_BUS and the second data bus DATA_BUS2 in communication with the controller 940. The controller 940 may back up and restore data by accessing independently the first volatile memory devices 911 to 914 through setting command address latencies CAL to different values. Similarly, the controller 940 may back up and restore data by accessing independently the second volatile memory devices 921 to 924 through setting command address latencies CAL to different values.

In one or more exemplary embodiments, the functions described herein may be realized in hardware, software, firmware or any combination thereof. If realized in software, the functions may be stored or transmitted as one or more instructions or codes on a machine-readable medium, that is, a computer program product such as a computer-readable medium. The computer-readable medium includes a communication medium including a computer storage medium and any medium that facilitates transfer of a computer program from a place to another place. A storage medium may be any usable medium that may be accessed by a computer. In a non-limiting example, such a computer-readable medium may be accessed by a RAM, a ROM, an EEPROM, a CD-ROM, an optical disk memory device, a magnetic disk memory device, a magnetic storage device or a computer, and may include any medium that may be used in carrying or storing desired program codes in the form of instructions or data structures. The disk and the disc as used herein include a compact disc (CD), a laser disc, an optical disc, a digital versatile disc (DVD), a floppy disk and a blue-ray disc, in which the disk usually reproduces data magnetically but the disc reproduces data optically. Thus, any combination thereof should be included within the scope of a computer-readable medium.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory module comprising:
    a plurality of volatile memory devices sharing a data bus through which data is transmitted and a control bus through which a command and an address are transmitted;
    at least one nonvolatile memory device; and
    a controller configured to back up data stored in the plurality of volatile memory devices in the nonvolatile memory device or restore data backed up in the nonvolatile memory device to the plurality of volatile memory devices, according to a fail/recovery of power of a host, the controller including a power-down interrupt logic configured to interrupt a backup operation when the power of the host is recovered while performing the backup operation,
    the power-down interrupt logic comprising:
    a logic configured to determine whether a sufficient amount of erased blocks for data backup exist in the nonvolatile memory device, to prepare for a fail in the power of the host;
    a logic configured to erase a new block when the sufficient amount of erased blocks do not exist in the nonvolatile memory device; and
    an interrupt backup logic configured to
        set a command address latency (CAL) for identifying the volatile memory device having the data corresponding to the erased block among the plurality of volatile memory devices which share the data bus and the control bus, to a first value;
        set a command address latency of remaining volatile memory devices among the plurality of volatile memory devices, to a second value different from the first value;

read the volatile memory by using the setting value of the command address latency (CAL); and back up a volatile memory device having data corresponding to an erased block of the nonvolatile memory device, in the nonvolatile memory device, when a fail in the power of the host is detected or a backup operation is instructed from the host.

2. The nonvolatile memory module according to claim 1, wherein the second value is greater than the first value, and a difference between the second value and the first value is equal to or greater than a row address to column address delay time (tRCD: RAS to CAS delay).

3. The nonvolatile memory module according to claim 2, wherein the difference between the second value and the first value is less than a row precharge time (tRP).

4. The nonvolatile memory module according to claim 1, wherein the controller resumes the backup operation interrupted by the power-down interrupt logic, after performing the backing up by the interrupt backup logic.

5. The nonvolatile memory module according to claim 1, wherein the controller resumes the backup operation interrupted by the power-down interrupt logic, after performing the backing up by the interrupt backup logic.

6. The nonvolatile memory module according to claim 2, wherein the controller resumes the backup operation interrupted by the power-down interrupt logic, after performing the backing up by the interrupt backup logic.

7. The nonvolatile memory module according to claim 3, wherein the controller resumes the backup operation interrupted by the power-down interrupt logic, after performing the backing up by the interrupt backup logic.

8. The nonvolatile memory module according to claim 1, wherein the interrupt backup logic comprises:

a logic configured to perform a distributed refresh operation for uniformly distributing a refresh cycle over the plurality of volatile memory devices while programming a memory page of the nonvolatile memory device;

a logic configured to operate the plurality of volatile memory devices under a low power mode having a power lower than a power of a complete operation state, while a new memory page of the nonvolatile memory device is prepared and written; and a logic configured to recover the plurality of volatile memory devices to a power mode of the complete operation state after the new memory page of the nonvolatile memory device is written.

9. The nonvolatile memory module according to claim 1, wherein the interrupt backup logic comprises:

a logic configured to perform a distributed refresh operation for uniformly distributing a refresh cycle over the plurality of volatile memory devices while programming a memory page of the nonvolatile memory device;

a logic configured to operate the plurality of volatile memory devices under a low power mode having a power lower than a power of a complete operation state, while a new memory page of the nonvolatile memory device is prepared and written; and a logic configured to recover the plurality of volatile memory devices to a power mode of the complete operation state after the new memory page of the nonvolatile memory device is written.

10. The nonvolatile memory module according to claim 2, wherein the interrupt backup logic comprises:

a logic configured to perform a distributed refresh operation for uniformly distributing a refresh cycle over the plurality of volatile memory devices while programming a memory page of the nonvolatile memory device;

a logic configured to operate the plurality of volatile memory devices under a low power mode having a power lower than a power of a complete operation state, while a new memory page of the nonvolatile memory device is prepared and written; and a logic configured to recover the plurality of volatile memory devices to a power mode of the complete operation state after the new memory page of the nonvolatile memory device is written.

11. The nonvolatile memory module according to claim 3, wherein the interrupt backup logic comprises:

a logic configured to perform a distributed refresh operation for uniformly distributing a refresh cycle over the plurality of volatile memory devices while programming a memory page of the nonvolatile memory device;

a logic configured to operate the plurality of volatile memory devices under a low power mode having a power lower than a power of a complete operation state, while a new memory page of the nonvolatile memory device is prepared and written; and a logic configured to recover the plurality of volatile memory devices to a power mode of the complete operation state after the new memory page of the nonvolatile memory device is written.

12. A method for operating a nonvolatile memory module including a plurality of volatile memory devices which share a data bus through which data is transmitted and a control bus through which a command and an address are transmitted, a nonvolatile memory device, and a controller which backs up data stored in the plurality of volatile memory devices in the nonvolatile memory device or restores data backed up in the nonvolatile memory device to the plurality of volatile memory devices, according to a fail/recovery of power of a host, the method comprising:

interrupting, by the controller, a backup operation when the power of the host is recovered while performing the backup operation;

determining, by the controller, whether a sufficient amount of erased blocks for data backup exist in the nonvolatile memory device, to prepare for a fail in the power of the host which may occur;

erasing, by the controller, a new block when the sufficient amount of erased bocks do not exist in the nonvolatile memory device; and backing up, by the controller, a volatile memory device having data corresponding to an erased block of the nonvolatile memory device, in the nonvolatile memory device, when a fail in the power of the host is detected or a backup operation is instructed from the host, wherein the backing up of the volatile memory device comprises:

setting a command address latency (CAL) for identifying the volatile memory device having the data corresponding to the erased block among the plurality of volatile memory devices which share the data bus and the control bus, to a first value;

setting a command address latency of remaining volatile memory devices among the plurality of volatile memory devices, to a second value different from the first value;

reading the volatile memory by using the setting value of the command address latency (CAL).

13. The method according to claim 12, wherein the second value is greater than the first value, and a difference between the second value and the first value is equal to or greater than a row address to column address delay time (tRCD: RAS to CAS delay).

14. The method according to claim 13, wherein the difference between the second value and the first value is less than a row precharge time (tRP).

15. The method according to claim 12, wherein the controller resumes the backup operation interrupted when the power of the host is recovered while performing the backup operation, after performing the backing up of a volatile memory device having data corresponding to an erased block of the nonvolatile memory device.

16. The method according to claim 12, wherein the controller resumes the backup operation interrupted when the power of the host is recovered while performing the backup operation, after performing the backing up of a volatile memory device having data corresponding to an erased block of the nonvolatile memory device.

17. The method according to claim 12, wherein the backing up of a volatile memory device having data corresponding to an erased block of the nonvolatile memory device comprises:

performing a distributed refresh operation for uniformly distributing a refresh cycle over the plurality of volatile memory devices while programming a memory page of the nonvolatile memory device;

operating the plurality of volatile memory devices under a low power mode having a power lower than a power of a complete operation state, while a new memory page of the nonvolatile memory device is prepared and written; and recovering the plurality of volatile memory devices to a power mode of the complete operation state after the new memory page of the nonvolatile memory device is written.

18. The method according to claim 12, wherein the backing up of a volatile memory device having data corresponding to an erased block of the nonvolatile memory device comprises:

performing a distributed refresh operation for uniformly distributing a refresh cycle over the plurality of volatile memory devices while programming a memory page of the nonvolatile memory device;

operating the plurality of volatile memory devices under a low power mode having a power lower than a power of a complete operation state, while a new memory page of the nonvolatile memory device is prepared and written; and recovering the plurality of volatile memory devices to a power mode of the complete operation state after the new memory page of the nonvolatile memory device is written.

* * * * *